(12) United States Patent
Moulin

(10) Patent No.: US 7,363,856 B1
(45) Date of Patent: Apr. 29, 2008

(54) FLAT BED PLATESETTER SYSTEM

(75) Inventor: Michel Moulin, Apples (CH)

(73) Assignee: Kodak Polychrome Graphics GmbH, Osterode (DE)

( * ) Notice: Subject to any disclaimer, the term of this patent is extended or adjusted under 35 U.S.C. 154(b) by 0 days.

(21) Appl. No.: 09/913,780

(22) PCT Filed: Feb. 17, 2000

(86) PCT No.: PCT/EP00/01302

§ 371 (c)(1),
(2), (4) Date: Jan. 2, 2002

(87) PCT Pub. No.: WO00/49463

PCT Pub. Date: Aug. 24, 2000

(30) Foreign Application Priority Data

| Feb. 17, 1999 | (EP) | 99103116 |
| Mar. 12, 1999 | (EP) | 99104944 |
| Mar. 26, 1999 | (EP) | 99105135 |
| Jul. 2, 1999 | (EP) | 99112797 |

(51) Int. Cl.
  *B41C 3/08* (2006.01)
  *B41N 6/00* (2006.01)
  *B41N 3/00* (2006.01)
  *B41M 5/00* (2006.01)
  *B41M 5/26* (2006.01)

(52) U.S. Cl. .................... 101/467; 101/401.1

(58) Field of Classification Search ............. 101/463.7, 101/467, 401.7, 401.1; 347/262, 264; 198/619, 198/629, 777, 727, 736, 747, 738, 468.4, 198/471.1, 750.12, 867.03, 803.5, 717, 721; 193/35 R; 271/264, 266
See application file for complete search history.

(56) References Cited

U.S. PATENT DOCUMENTS

| 2,982,387 | A | * | 5/1961 | Hinckely .................. 193/35 R |
| 3,845,711 | A | * | 11/1974 | Helms ........................ 101/111 |
| 4,015,702 | A | * | 4/1977 | Bergling .................. 198/803.3 |
| 4,417,260 | A | | 11/1983 | Kawai et al. |
| 4,746,942 | A | | 5/1988 | Moulin ......................... 354/5 |
| 4,764,815 | A | * | 8/1988 | Landsman .................. 358/496 |
| 4,792,049 | A | * | 12/1988 | Janoick et al. ............. 209/556 |
| 4,887,706 | A | * | 12/1989 | Gladish et al. ........... 198/774.1 |
| 5,115,920 | A | * | 5/1992 | Tipton et al. .............. 211/59.2 |
| 5,220,356 | A | * | 6/1993 | Yaginuma .................... 347/225 |
| 5,227,606 | A | * | 7/1993 | Weeks et al. .......... 219/121.67 |
| 5,339,737 | A | * | 8/1994 | Lewis et al. ................ 101/454 |
| 5,437,360 | A | * | 8/1995 | Eberhard ................. 198/460.2 |

(Continued)

FOREIGN PATENT DOCUMENTS

EP         0558781         9/1993

(Continued)

*Primary Examiner*—Ren Yan
*Assistant Examiner*—Leo T Hinze
(74) *Attorney, Agent, or Firm*—Faegre & Benson, LLP; Mark G. Bocchetti; David A. Novais

(57) ABSTRACT

The present invention provides a flat bed platesetter system and a method for its use, particularly for imaging printing plates. For providing a precise, continuous, rapid and format-independent system which is reliable, the present invention suggests to move the printing plate relative to a stationary bridge carrying a radiant energy emitting head by means of a low inertia carriage member effectively connecting the printing plate and drive means.

31 Claims, 19 Drawing Sheets

U.S. PATENT DOCUMENTS

| | | | |
|---|---|---|---|
| 5,606,172 A * | 2/1997 | Morita et al. | 250/492.2 |
| 5,635,976 A * | 6/1997 | Thuren et al. | 347/253 |
| 5,870,624 A * | 2/1999 | Kikinis | 710/2 |
| 5,909,236 A * | 6/1999 | Pedersen | 347/257 |
| 5,934,195 A * | 8/1999 | Rinke et al. | 101/401.1 |

FOREIGN PATENT DOCUMENTS

| | | |
|---|---|---|
| EP | 0599100 | 6/1994 |
| WO | 9635144 | 11/1996 |
| WO | 9705736 | 2/1997 |

* cited by examiner

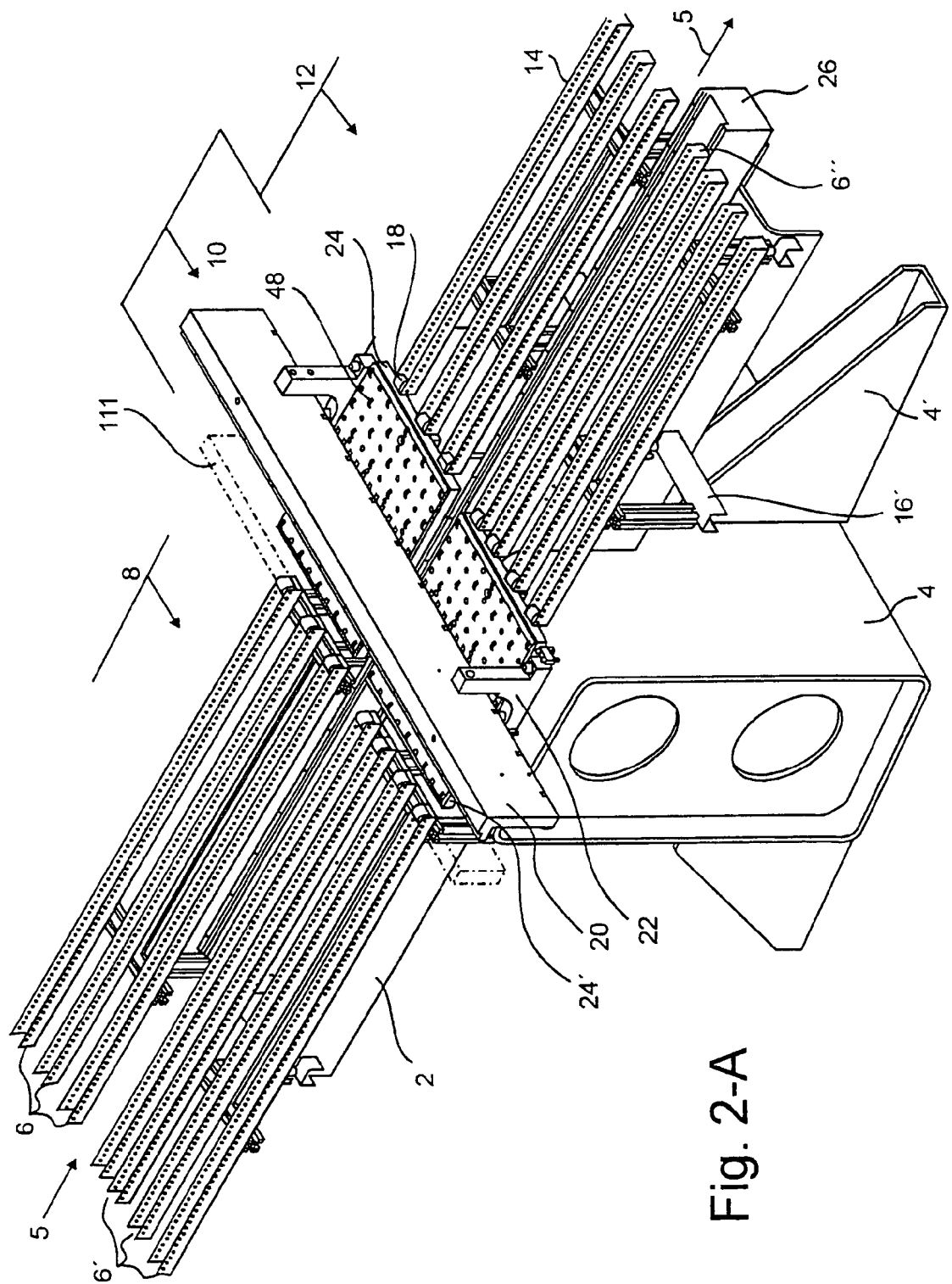
Fig. 2-A

Fig. 3
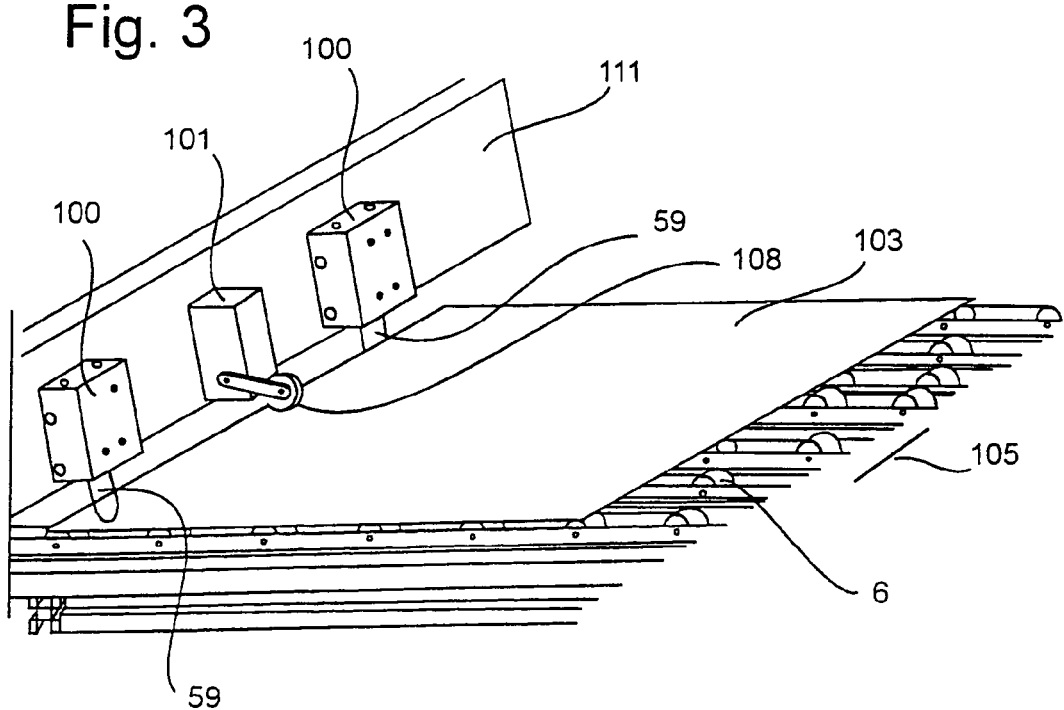
Fig. 3-A
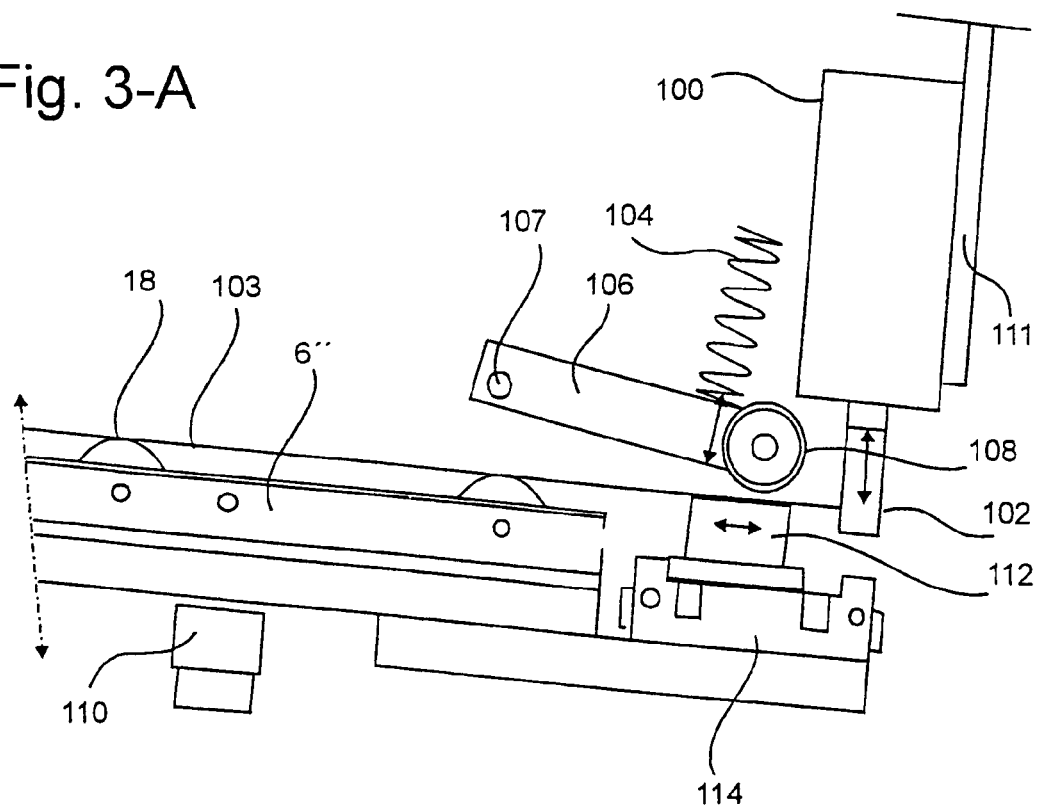

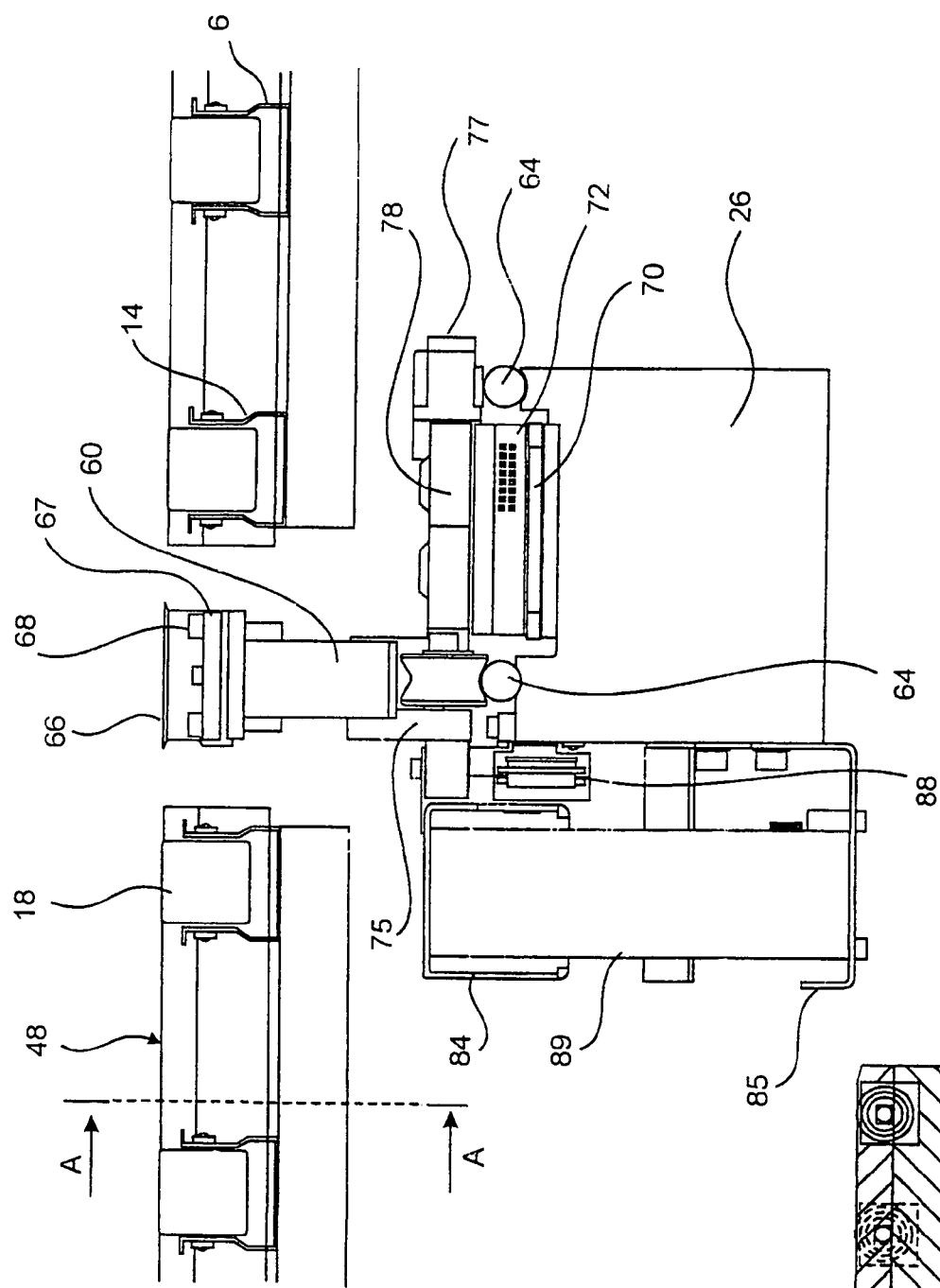
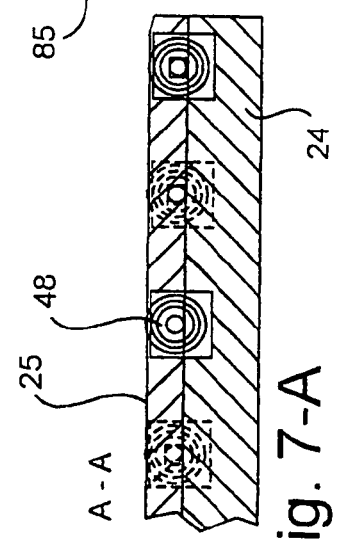
Fig. 7
Fig. 7-A

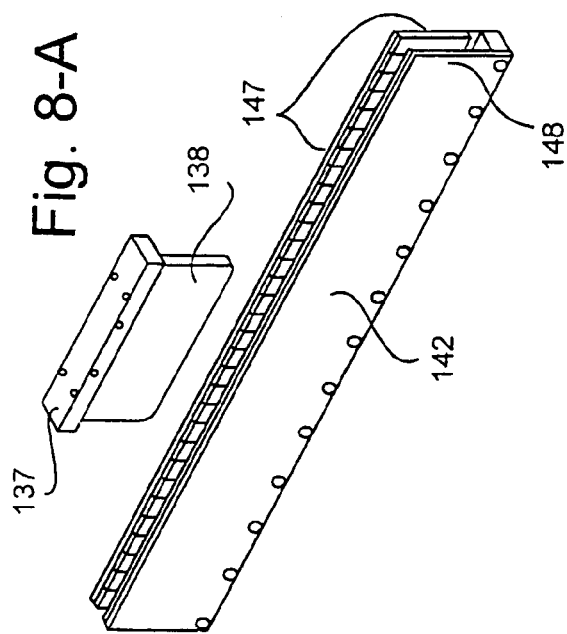
Fig. 8-A
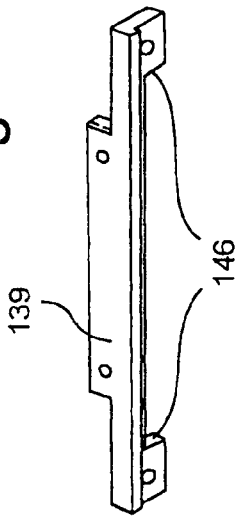
Fig. 8-B
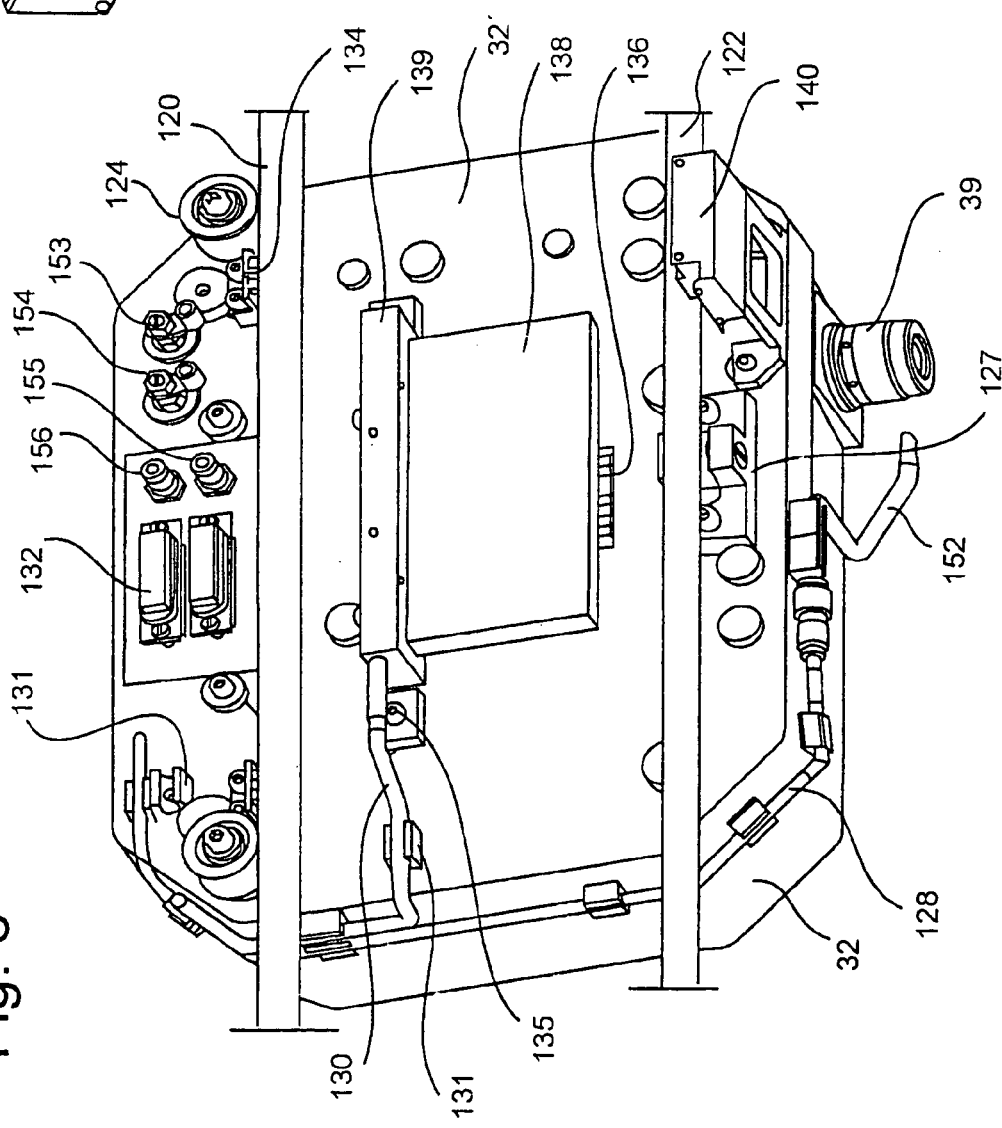
Fig. 8

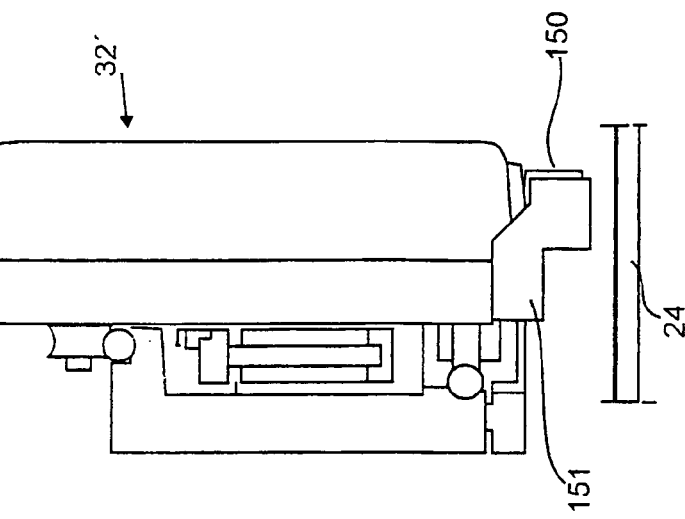
Fig. 10-A
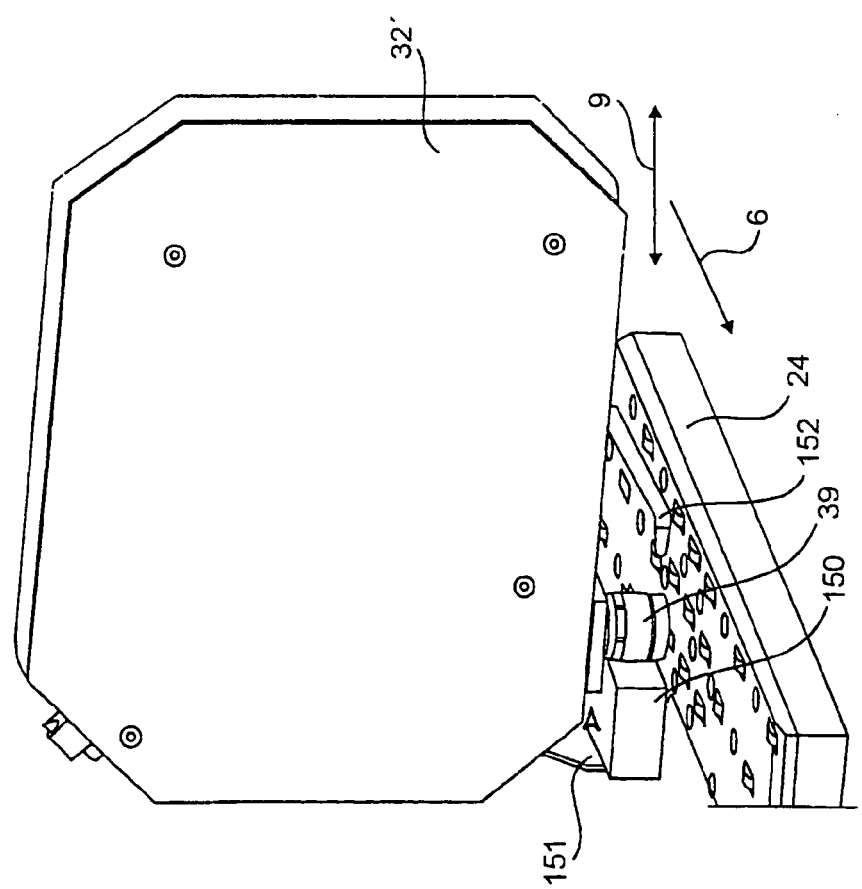
Fig. 10

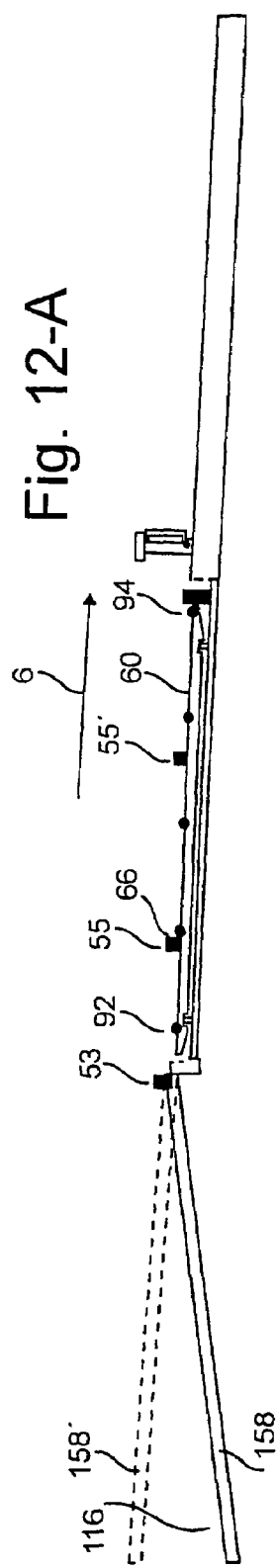
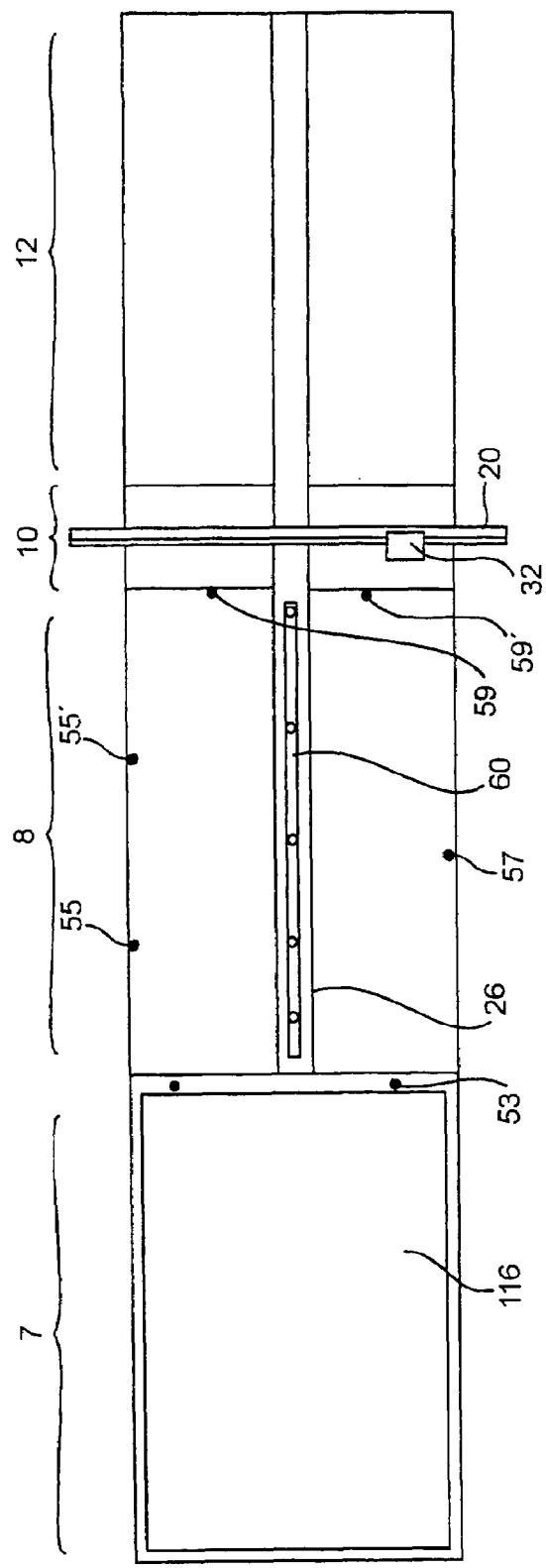

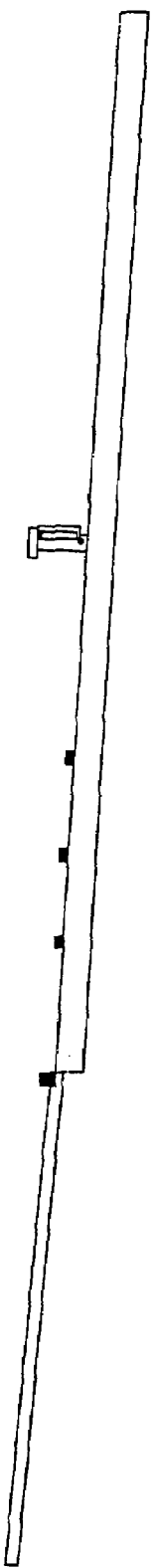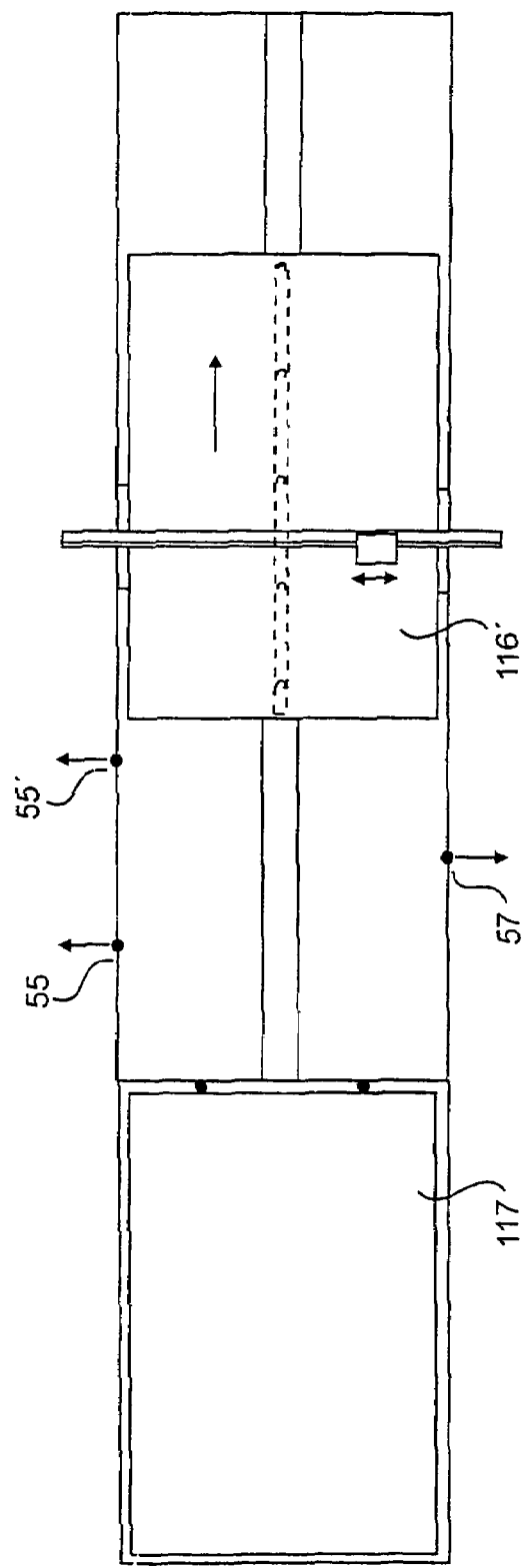

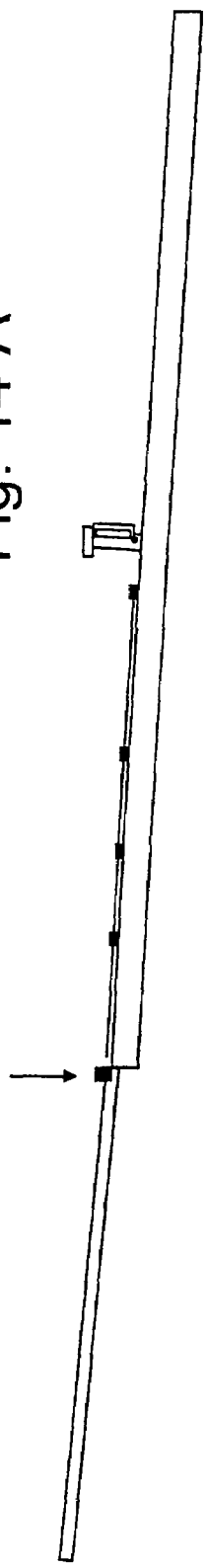
Fig. 14-A
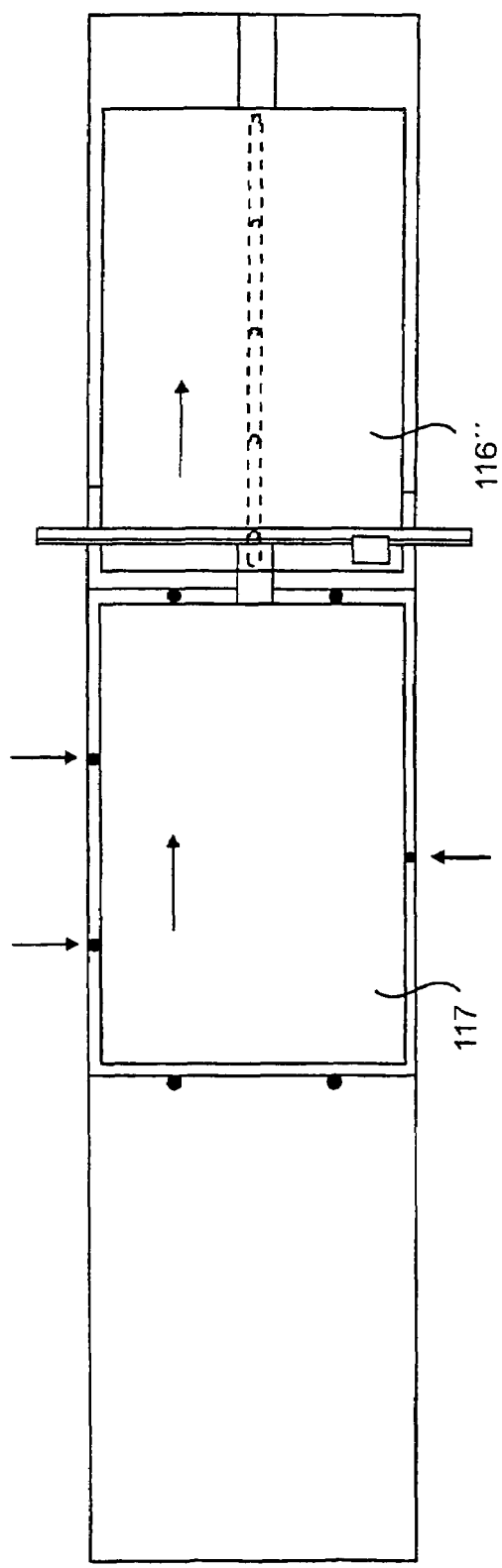
Fig. 14-B

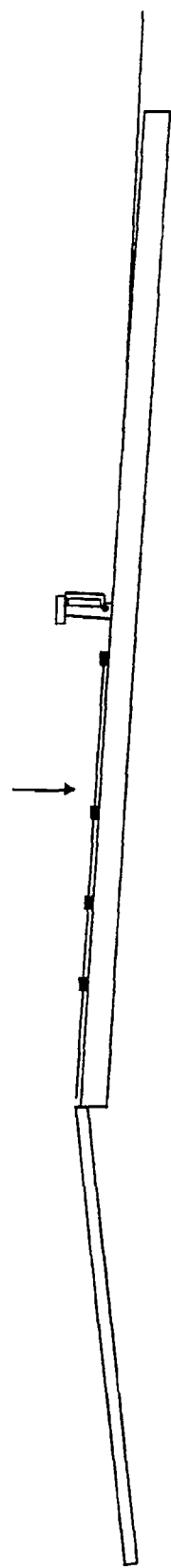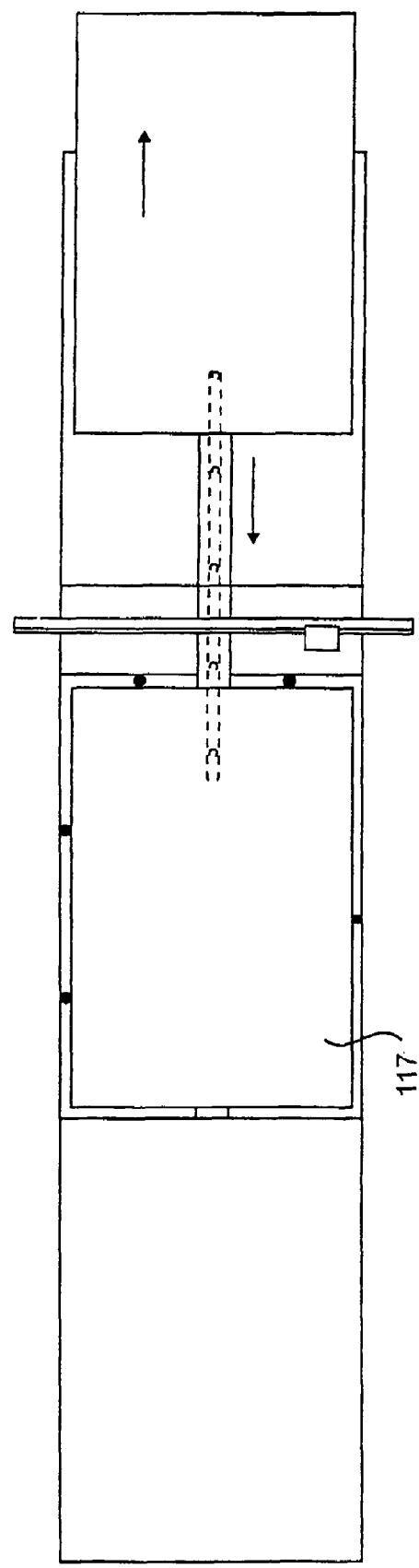
Fig. 15-A
Fig. 15-B

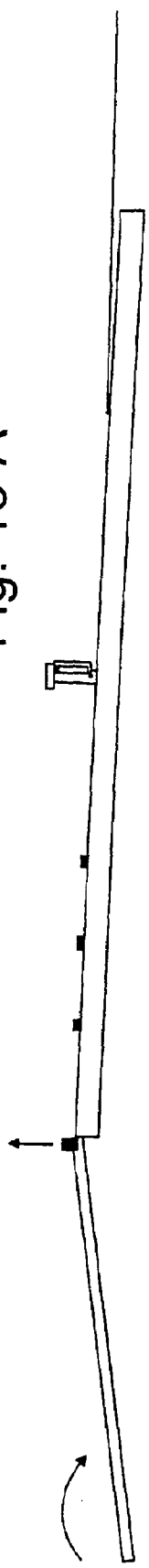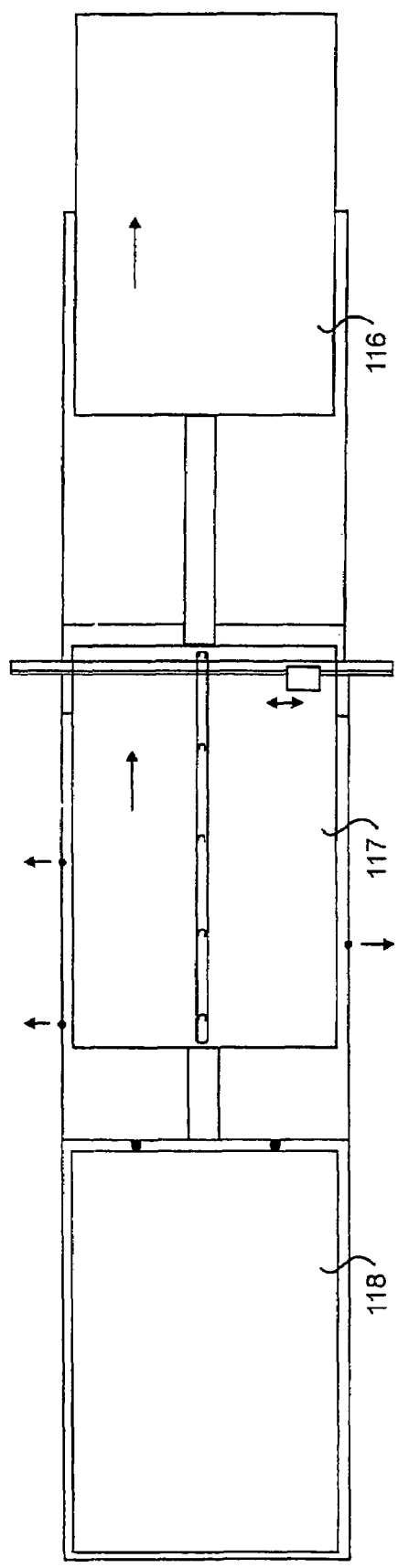

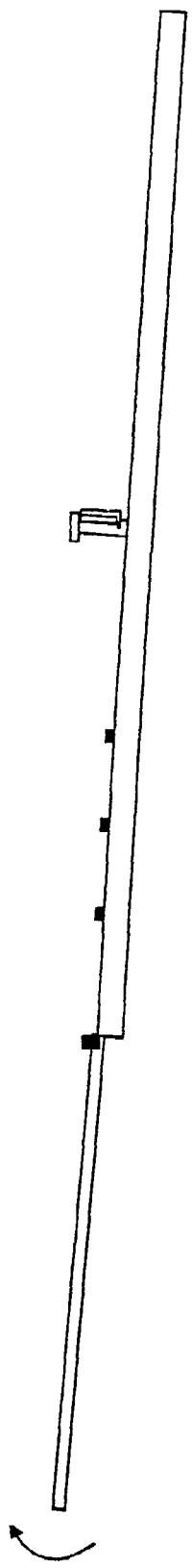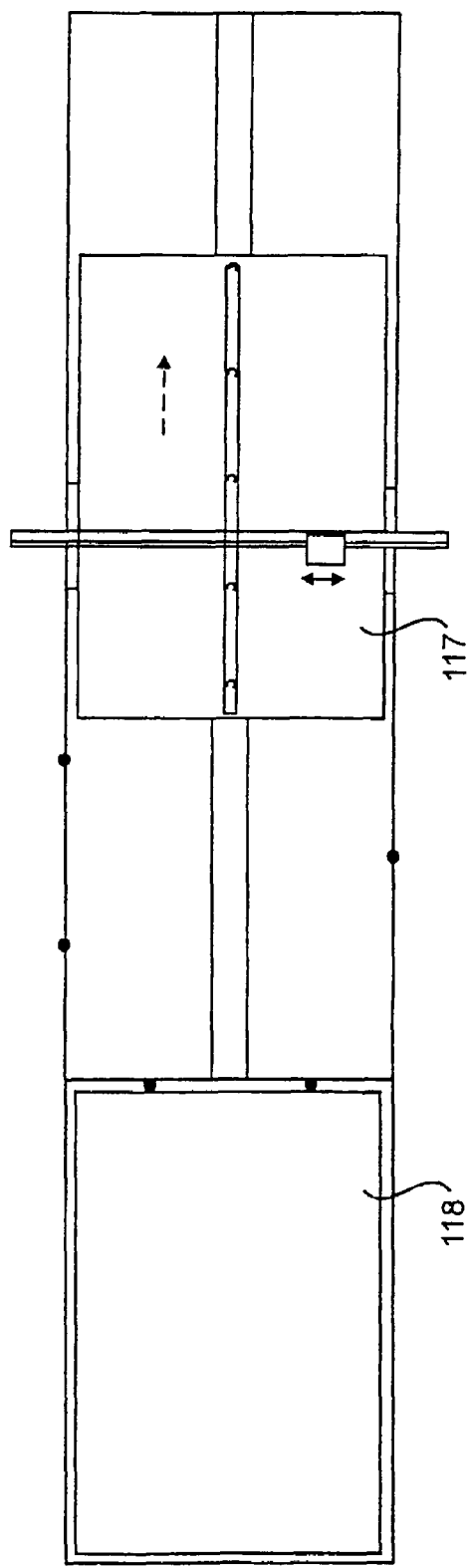

FLAT BED PLATESETTER SYSTEM

CROSS-REFERENCE TO RELATED APPLICATION

This application is a national phase application which claims priority from International Application No. PCT/EP00/01302, which was published in English as WO 00/49463 on Aug. 24, 2000, which in turn claims priority from EP99103116.2, EP99104944.6, EP 99105135.0, and EP9112797.8.

FIELD OF THE INVENTION

The present invention relates in general to the imaging of offset printing plates and more particularly to a multibeam system and method for imaging modulated beams of radiant energy (in a flat printing plate.

BACKGROUND OF THE INVENTION

Machines presently used for the production of printing plates by exposing their sensitized surface to light or heat rays generally produced by laser rays are commonly known as platesetters. In these machines a flexible plate is wrapped around the outside or inside of a drum. Devices of this kind require delicate and time consuming operations for introducing, forming and straightening plates as illustrated in U.S. Pat. No. 5,699,740.

Among other machines avoiding the use of a drum, a photocomposer has been constructed as described in U.S. Pat. No. 4,746,942 under the title of "Photocomposing Machine and Method" by same inventor. This machine is more appropriate for film imaging than for printing plates of some rigidity such as metal plates. It includes a laser at a fixed location remote from the plate, necessitating complex optical means that limit the size of the imaging area. In addition, the driving of the photosensitive material by pinch rollers located at a certain distance from the imaging head has the general problems associated with the use of pinch rollers for wide material. It is difficult to adjust and does not insure accurate displacement of both margins of the film and exact repeatability.

Another flat bed scanner described in U.S. Pat. No. 4,764,815 involves the use of a complex pneumatic double-platen system to carry and step the media to be scanned. The reciprocating head mechanism includes inertia operated springs, and a complex and expensive hard to control acousto-optic deflector unit located at a fixed position with mirror means to transfer light beams to the reciprocating head with no focusing means for imaging.

Among flat bed machines, there are also photoplotters based on the use of interlaced light emitting diodes located on an imaging head above a photosensitive plate fixed to a heavy table. In these machines, a considerable mass must be moved and the illumination they provide is not adequate for the sensitivity of metal plates and for high production rates.

Another device based on essentially the same configuration of a projection head moving in two perpendicular directions over a fixed plate is described in GB-A-2 299 728 (Neilson et al.). This particular device scans a light beam across the surface of a photosensitive plate attached to a bed. It comprises a bridge that extends across the bed from one side to the other, supported at each end by independent carriages movable along rails located on the side of the bed perpendicular to the bridge. A scanning head can move along guides extending the length of the bridge. Drive means and position location means are located at each end of the bridge and control means monitor the operation of each drive means in accordance with position information. The device is located above a storage for plates and means are provided for selecting plates of the desired size and feeding them upwards and to a layer of air at a location defined by stops.

Other flat bed devices use a laser beam deviated by a rotating mirror associated with a continuously moving film or plate. The scanning length of these deflection devices is limited. The use of several adjacent deflection systems could be utilized to extend the scanning range but at the cost of expensive and difficult beam junction means.

For the exposition of thermosensitive printing plates, the machines using a deflection device apply a YAG laser pumped by thermostabilized laser diodes and an acoustic or optical modulator. Besides the high costs, these devices are limited in power and modulation frequency. They do not satisfy the purposes of the present invention.

The production speed is not important in imaging machines outside the field of the present invention. For example U.S. Pat. No. 4,746,942 describes a machine for imaging substrates for the electronic industry where output quality is primordial and speed secondary. According to this document the substrate-supporting table weighs six times more than the printing plate and its moving mechanism of the present invention. This difference that could be translated in terms of productivity precludes the use of this device for the printing industry.

Multibeam devices where each beam is produced by an individually controlled emitter do not show these limitations. However, the number of emitters is limited for economic considerations, for example to 64. To achieve the desired performance, the radiation-sensitive support (printing plate) should move at more than 5 meters/second. This speed can only be obtained with machines where the support must be wrapped around the outside or inside of a drum.

In a flat bed device where a flat printing plate of some rigidity should not be deformed, several hundreds of beams are necessary and the best, if not the only, solution is the use of a spatial modulator as described for example in U.S. Pat. No. 4,746,942 (Moulin). In this document the laser and modulation components were at a fix location remote from the device not to overload the moving optics and adversely affecting the speed of the machine.

The inventor and his team in the years following the filing of the patent referred to above have been able, through innovation and taking advantage of present-day available components, to reduce the size and weight of the multibeam source, so that it can be attached to a fast-moving scanning head.

The power outputted by the head and the number of spots (256) make it possible to conceive a flat bed device operating in a start-stop fashion. In this concept, the support must be moved and stopped accurately and quickly during the direction reversal of the optical head. In order to insure desirable image quality, the distance between the support and the projection lens must be accurate within 50 microns. This result could be obtained by firmly attaching the radiation sensitive support to the accurately flat surface of a table moving in a start-stop fashion. This solution is unacceptable in a machine that should produce printing plates at a high rate (for example for the newspaper industry) for it would take too long for the table to be moved and stabilized because of its inertia.

SUMMARY OF THE INVENTION

It is therefore an object of the present invention to provide an improved flat bed platesetter and an improved method for its use. In platesetters, images should be accurately positioned in relation with the edges of the support. The metrology of the exposition system must continuously and accurately know the location of the support in relation to the location of the projected spots. Thus, the support must be accurately positioned when introduced for imaging at a loading station or optical sensors must detect its location. These operations are time consuming. When a plate is being loaded and positioned on the loading section of the machine, a previously loaded plate is being imaged. It is thus another object of the invention to minimize processing time and increase the production rate of a platesetter through an almost continuous flow of plates under the imaging head. These objects are achieved with the features of the claims.

One aspect of the present invention is an improved flat bed platesetter with a method for its use either as an independent unit or within the framework of a complete plate making system with multiple imaging units.

The platesetter as per this invention is more specifically designed for direct production of images obtained by the projection of successive swathes of spots onto the thermosensitive or photosensitive surface of a printing plate. In the flat bed platesetter according to the present invention, a radiant energy emitting head moves transversally to the feed direction of a printing plate sensitive to the radiant energy emanating from the head. The radiant energy may be visible light, infrared, ultraviolet or any other electromagnetic radiation capable of forming a potential image on a printing plate. The optical imaging head includes a spatial modulator illuminated by laser emitters and associated optics capable of forming the image of the modulator on the printing plate surface. It is caused to move crosswise to the direction of the plate motion for the spacing of successive swathes. It is characterized by containing substantially all the electronic and optical components necessary to produce a swath of images on the plate during each back-and-forth excursion. The section of the plate opposite the optical head path is securely maintained in a flat plane preferably by the combined action of rollers located under and above the plate.

The images consist of columns of spots whose intensities are individually controlled by a modulator. The printing plate is slidably movable over a low friction bed by vacuum grippers attached to a low-inertia sliding carriage member, thereafter also referred to as "plate mover slide". The grippers, preferably integral with the sliding carriage, hold the plate securely during its passage through the imaging zone to accurately space adjacent swaths.

According to a feature of the invention, the printing plate, regardless of its size is automatically, squared against collapsible stops in the support area before being gripped by the vacuum grippers of the plate mover slide.

According to a feature of a first embodiment of the invention, the plate to be imaged is also automatically centered between the edges of the loading area by the combined action of lateral pins.

According to a feature of a second embodiment of the invention, the centering of the image between the edges of the plate is obtained by electronic means.

The plate handling system as per the present invention is partially characterized by the combination of a low-friction stationary support bed in which the plate rests during its travel through the machine and a relatively narrow plate mover unit is located under the plate. The primary function of the bed is to hold the plate flat and of the plate mover to slide it over the bed.

In a preferred embodiment the bed is a field of rollers or ball bearings and the plate mover is a light elongated drive carriage with a line of gripper suction cups. It is located under the plate in a substantially central area of the support field, except for a narrow protruding section rising to the plate level. The plate slides in unison with the drive carriage when the vacuum suction cups are energized in order to space successive swaths until the plate has been completely exposed. Then, the suction cups are de-energized and the carriage is returned to its initial position to pick up the following plate that has been sitting against stops located at the end of an inclined plane.

The bed includes a section below the path of the shuttling optical head provided with a field of very accurate bearings against which the plate is firmly maintained in the focal plane by a group of bearings urged against the plate by springs or by gravity.

The flat bed platesetter system and the method for its use according to the present invention have in particular the advantages that they combine simplicity, reliability, rapidity and precision. This precision in particular allows the exact imaging of four printing plates to be used in four-color printing machines.

These features are obtained by the use of few movable elements of low inertia to obtain great accuracy and high productivity. For example, a plate of 1.5 by 2 meters can be accurately stepped 5 millimeters in 80 milliseconds following the imaging of a swath with an accuracy of the order of 2 microns, sufficient to avoid banding. The non-productive time between the imaging of two successive plates can be reduced to a few seconds. The incident radiant energy reaching the plate can be over 20 watts for certain applications such as the imaging of thermosensitive offset printing plates of large format.

One characteristic of the present invention is the use of two light-weight carriages moving alternatively along paths at right angles and in timed relation to image a printing plate of any format and rigidity. Each carriage is driven by a high-efficiency-linear motor whose motion is controlled by special circuits to avoid or minimize the effects of inertia.

According yet to another feature of the invention, plates fed to the machine are delivered on a field of ball or roller bearings. The field may be sufficiently inclined to let the plate slide by gravity to squaring stops until picked up by the plate mover carriage returned home at the end of the imaging of the previous plate.

According to another characteristic of the invention, the imaging head is provided with substantially all the electronic and optical components necessary to produce and project a swath of images on the plate. During the imaging sections of its excursions at a constant speed, the plate is securely maintained in place by the grippers of the plate-mover carriage.

The invention concerns also a new set-up for the serial production of printing plates in which a plate handling system is associated with a number of stand-alone platesetters.

Other objects, features and advantages of the invention will be apparent from the following detailed description when read in conjunction with the accompanying drawings that show by way of illustration, and not limitation, preferred embodiments of the invention.

BRIEF DESCRIPTION OF THE DRAWINGS

FIG. 1-A is a schematic view of part of the plate bed of the machine.

FIG. 2-A represents another view of the flat bed platesetter seen from the plate output side.

FIG. 3 represents schematically a mechanism to accurately square a plate on the machine bed.

FIG. 3-A is a more detailed view of the plate positioning mechanism.

FIG. 7 is an end view of the plate mover carriage. FIG. 7-A is a partial cross section of FIG. 7.

FIG. 8 represents the optical head assembly as seen from the ouput side of the machine.

FIG. 8-A represents a linear motor of the type used to drive the head assembly. FIG. 8-B represents a bracket connecting the head to its linear motor.

FIG. 10 represents the face of the optical head as seen from the input side. FIG. 10-A is another side view of the optical head with the plate edge photoelectric detector.

FIGS. 12 to 17 represent schematically the travel through the system of successive plates. In each of these Figs., suffix A represents a side view and suffix B the corresponding plan view.

DESCRIPTION

Figure 1:
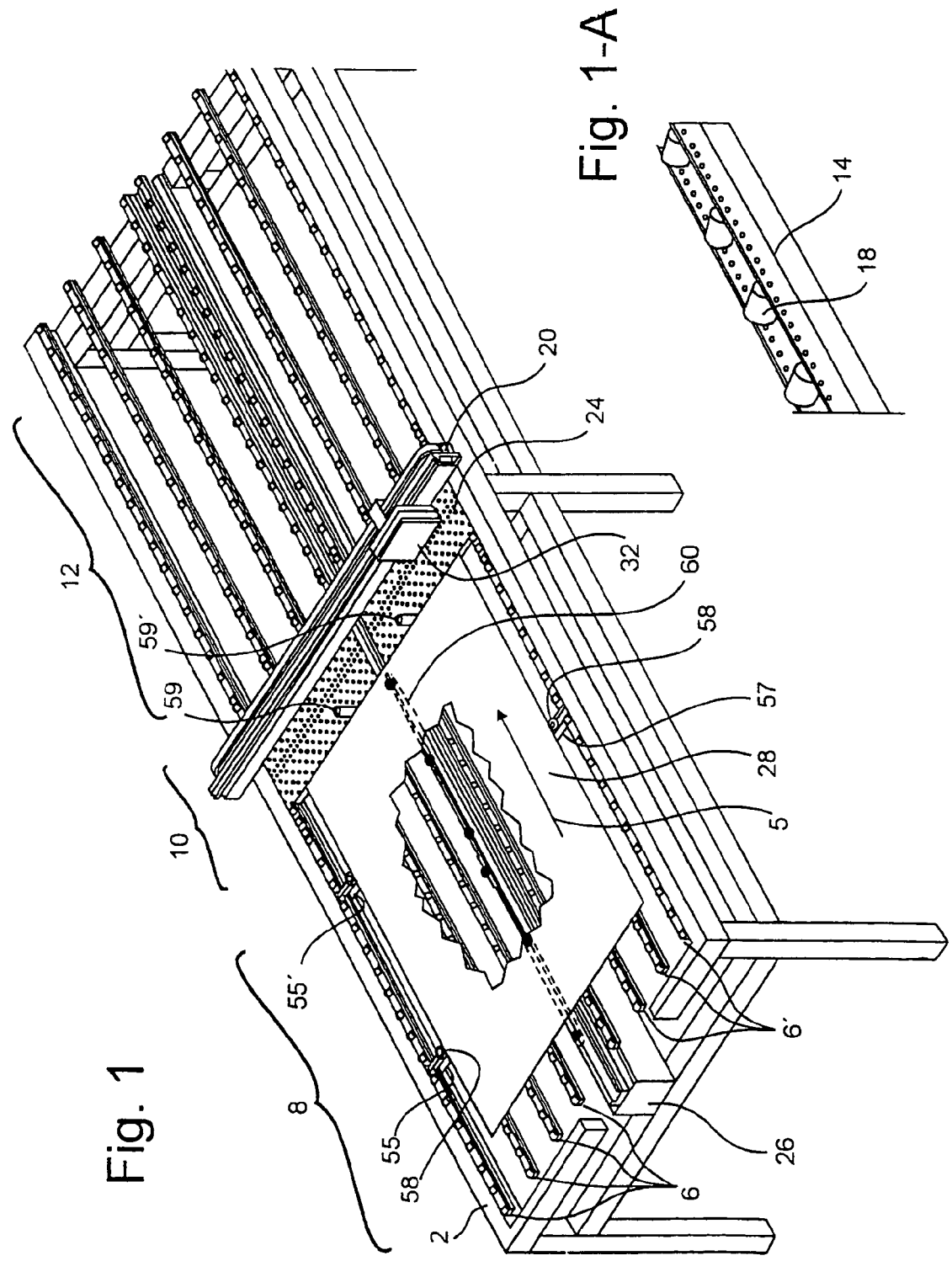
FIG. 1 is a schematically represented overall view of the flat bed platesetter according to the present invention.

The assembly shown in FIG. 1 schematically represents the machine and its most important components. To facilitate the description it can be divided into three zones: a loading zone 8, an imaging zone 10 and an ejection zone 12. These three zones include a bed of ball or linear bearings on which printing plates can ride. The bed of zones 8 and 12 may include standard bearings 18 supported by commercially available channels 14 as shown in FIG. 1-A. The supporting bed of imaging zone 10 preferably includes high precision bearings represented as dots in FIG. 1. Printing plates can be manually introduced to the loading zone 8 or automatically fed as will be described later in connection with FIG. 18. The loading zone may comprise positioning means to accurately position plate 28. The positioning means may comprise positioning elements 55, 55' and 57 at each lateral side of the loading area 8 and stop elements 59 and 59' at its downstream end, close to the junction of the loading and imaging zones. The lateral positioning elements 55, 55' and 57 are preferably movable in a direction transverse to the direction of movement 5 of the printing plate 28. The stop elements 59 and 59' are preferably movable up and down in a vertical direction. When they are positioned on the path of the plate they stop its sliding motion, until they receive a signal from the machine control to clear the passage as will be described later to let the plate proceed to the imaging area 10.

The plate may be centered in the transverse direction over the supporting bed by mechanical means. This may be obtained by the combined action of one positioning element 57 at one lateral side of the plate bed and two positioning elements 55 and 55' spaced apart from each other at the opposite lateral side. This configuration ensures a proper and defined position of the plate on the support area. Elements 55, 55' and 57 can be sliding bars provided at their end with small wheels or rollers 58 contacting the respective edges of the plate to be centered on the loading zone 8, and on the track followed by the plate moving carriage. By a known centering mechanism not shown, e.g., a pneumatic mechanism, elements 55 and 55' on one side and element 57 on the other side are simultaneously and resiliently moved toward the plate until it is centered.

To position the image area at equidistance between the edges of the plate, the exact mechanical centering of the plate may be replaced by electronic means as will be explained later.

Figure 4:
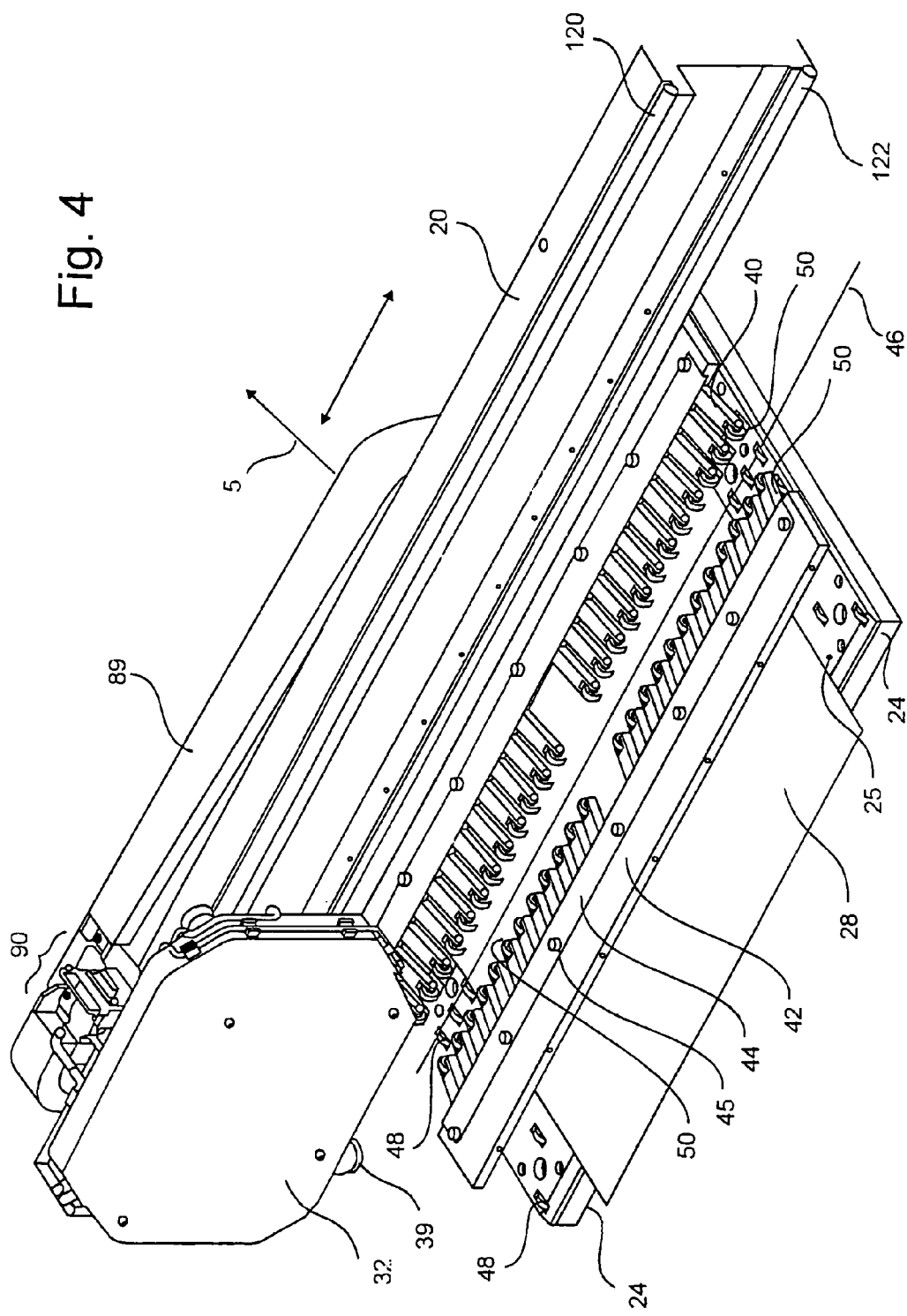
FIG. 4 represents a section of the bed at the imaging zone showing the optical head seen from the front and rows of pressure rollers.

The plate support area 24 encompassing the imaging zone 10 is made of precision bearings represented by dots in FIG. 1 instead of conventional linear bearings 18 located in other plate supporting areas, as will be shown more clearly in relation with FIG. 4. The beam supporting the plate-mover carriage is shown at 26. The reciprocating optical head 32 is shown on one of its rails 20. It travels over the plate maintained in the image plane with a precision of, e.g., ±50 microns by the combined action of precision bearings and pressure bearings (FIG. 4).

Figure 2:
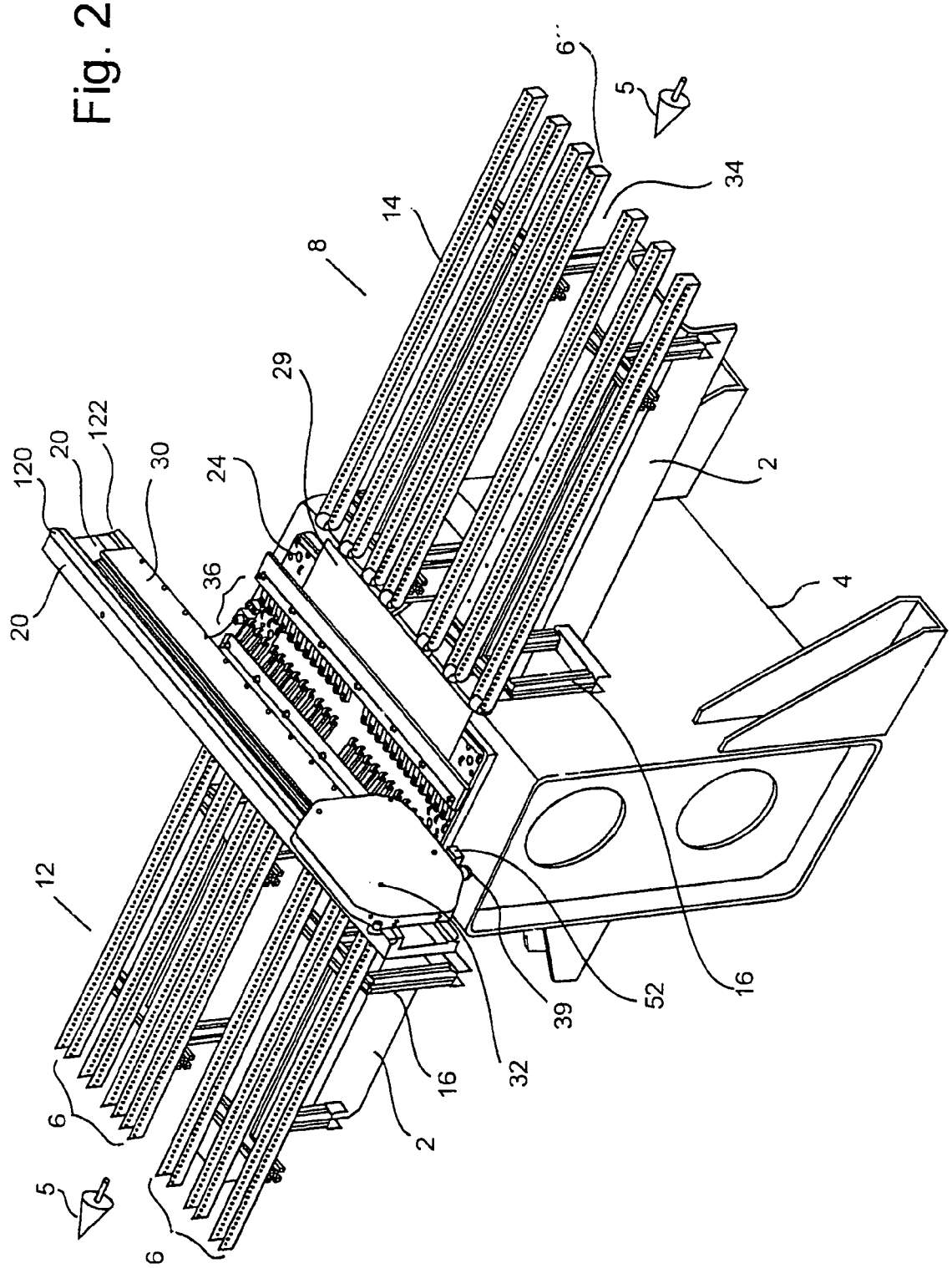
FIG. 2 represents an overall view of the flat bed platesetter according to the present invention seen from the plate input side.

FIG. 2 represents more clearly and with more details the machine viewed from the input side. The head carriage rails, located in substantially the same vertical plane are shown at 120 and 122. The fixed part of the head carriage linear motor is shown at 30. The relatively narrow area over which moves the imaging head is shown at 36 with a plate 29 located in this area. Rail 6", similar to the other rails, globally shown at 6, can be moved up slightly to clear the passage for the plate mover returning home as will be explained later in relation with FIG. 3-A. The elongated gap or valley 34 between rows of ball-bearings rails 6, shown void in the Figure, is the area reserved for the passage of the plate mover carriage not shown in this Figure. The platesetter table assembly is supported by heavy vertical supports 4 resting on the floor. The table is also supported by a number of vertical members 16 attached to a frame 2. This Figure also shows the general aspect of the optical head: a vertical, box-like unit 32, from which protrudes a lens 39 and a photodetector unit 52. The purpose of the latter, in one embodiment of the invention, is to define and set up the active imaging run of the head on the plate and to set up the controls to place images at its center.

FIG. 2-A is similar to FIG. 2, representing the table assembly as seen from the output side of the machine. In addition to the elements shown in the preceding Figure, the elongated beam supporting the rails on which the plate mover carriage slides is shown at 26. At a right angle with, i.e., perpendicular to this beam and above the plate area is located another beam or bridge 20 supported by legs 22. The plate supporting area of the table located in the imaging zone is represented by two units 24 and 24' separated by a gap provided for the passage of the plate handler. They are provided with precision ball or roller bearings 48.

The plate squaring system is schematically illustrated in FIGS. 3 and 3-A.

It is preferably supported by a bridge 111 located above the table area, parallel with the beam supporting the optical head and in the vicinity of the junction between the loading and imaging zones as shown in phantom lines in FIG. 2-A. FIG. 3 shows a plate 103 sitting on bed 105 of the loading zone 8 waiting to be pushed forward by a mechanism 101. This mechanism resiliently pushes the plate against squaring pins 59 and 59', respectively operated up and down by mechanisms located in box 100 and 100' to move corresponding pins below and above the plate tract. Before a plate is delivered to the loading zone, stop pins 59 and 59' represented by reference number 102 in FIG. 3-A are pushed down by appropriate pneumatic actuators represented at 100 and 100'. When a plate such as 103 is moved to the loading zone, for example, by sliding over an inclined support as shown in FIG. 12-B, it continues down the loading area until it is stopped by pins 59 and 59'. These pins are accurately located on a plane parallel with the optical head track and substantially perpendicular to the edge of the plate. When the plate 103 arrives in the vicinity of the pins 102, it is resiliently pinched between a block 112 and a wheel 108 mounted on a lever 106, pivoted at 107 and urged against the plate by a spring 104. Block 112 is attached to a small carriage 114 adapted to oscillate back and forth by the action of pneumatic means not shown. This procedure insures a firm sitting of plate 103 against the squaring stops 59 and 59' without the use of undue force.

Figure 5:
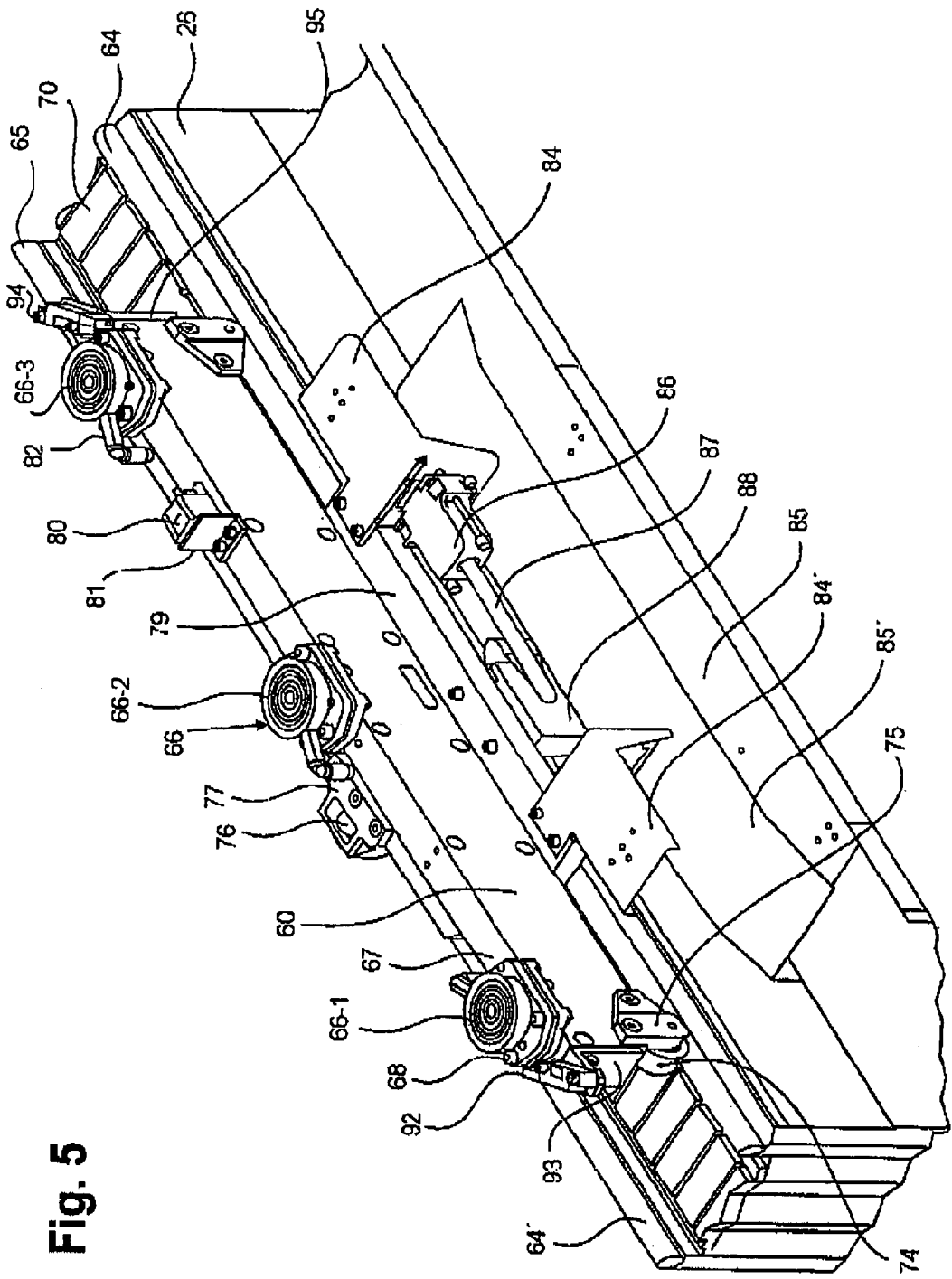
FIG. 5 is an isometric view of the plate mover carriage seen from one side.

FIG. 3-A also shows a pneumatically operated jack 110. Its purpose is to slightly lift the end of rail 6" (shown in FIGS. 2 and 2-A) to clear the way for the passage of the suction cups located at the top of the plate drive carriage when it returns home. This allows the suction pads of the carriage to easily slide under a plate in the "waiting" position. At the completion of the squaring procedure, and the return of rail 6" to its normal position, the vacuum grippers of the plate carriage are energized to firmly engage the plate. Then, the squaring components 100, 114 are de-energized and the pinching wheel is moved up away from the plate, now under the exclusive control of carriage 60 (FIG. 5).

The components of the machine are more clearly shown in FIG. 4 representing the imaging zone 10. Beam 20 extending across the machine above the field of precision bearings is provided with rails 120 and 122 on which the head carriage 32 can slide. These rails are located in substantially the same vertical plane, parallel with the face of the optical head. As shown in the Figure, head 32 is located on one side of beam 20. All the wiring connecting the electrical and electronic components of the head assembly with the outside world are channeled through a connector assembly 90 to one end of a flexible conduit 89 located on the other side of beam 20. The other end is attached to a fixed point outside the moving assembly. Together with electrical harness, located preferably in the same conduits, compressed air and cooling fluid are also provided between the moving head 32 and stationary sources.

Lens 39 attached to the carriage 32 moves along line 46 during each travel of carriage 32 over the portion of the plate 28 to be imaged and at an exact distance thereof. The plate is secured in the focus plane by the combined action of bearings such as 48 inserted into plate 24 and pressure bearings 50 as will be explained later in connection with FIG. 9. Each pressure bearing is attached to a pivoted lever 40 urged against the plate bed by spring or gravity. The pressure bearing assembly includes plates 42 and 44, also shown in FIG. 9.

The plate moving carriage will now be described in relation with FIGS. 5 and 6. The purpose of this carriage is to move the plate to be imaged by steps from the loading zone 8 through the imaging zone 10 and to the ejection zone 12 where it releases the plate before returning home under the following plate waiting in the loading zone 8. It is characterized by its special construction made of lightweight components and its narrow elongated shape. Referring now to FIG. 5, the body of the carriage is shown at 60 with extension 78. They are preferably made of light honeycomb material encased between carbon fibers plate with aluminum inserts for attaching screws. This construction provides rigidity and low weight, hence minimum inertia forces to overcome for the start and stop operations of the carriage. The mass of the parts to move for swath spacing, including the plate, has been reduced to approximately 4 kg.

The carriage is provided with two grooved wheels 74 supported by brackets 75 on one side and a roller 76 supported by bracket 77 on the other side, respectively, sitting on rails 64 and 64' attached to beam 26. For driving the carriage together with the printing plate an electric linear motor can be utilized. It may be of the type LEB-S-2-S available from Anorad, U.S.A. Its fixed part attached to beam 26 is shown at 70 and its mobile part attached to the sliding carriage is shown at 72, at or near its center of gravity. The combination of a light carriage of special construction and an appropriate linear motor makes it possible to move the carriage and the plate for swath spacing (5.12 mm) in less than 80 milliseconds, including the stabilization time, with an accuracy of 2 microns.

Three vacuum cups are located on the top surface of the carriage body, shown at 661,66-2 and 66-3 with air ducts 82. Each cup is made up of a soft rim and a harder core against which the plate is pulled. In order to place them vertically at the exact level of the focus plane, each suction cup unit is attached to a plate 67 mounted on the carriage body, secured and adjusted by screws 68. For large printing plates all suction cups are energized. For smaller plates, only two cups are energized. The number of cups to activate can be done by programming or electronically by a photo detector system as explained below. A photodetector device is shown at 94, supported by bracket 95. Its purpose is to make sure that there is no preceding plate sitting on the ejection zone 12 waiting to be moved to the processing area. Another photodetector 92 attached near the rear end of the body of the carriage is supported by bracket 93 to determine the presence or absence of a plate when the carriage is returned to its home position and to selectively energize the vacuum cups as explained above. Box 80, attached to the top of the unit by a bracket 81, contains photoelectric means to measure the intensity distribution of the radiation emanating from the optical head. Its purpose is to make it possible to adjust the intensity of pixel groups as explained in copending U.S. application Ser. No. 09/524,673 entitled "Pixel Intensity Control in Electro-Optic Modulators", filed on Mar. 13, 2000. For defining the exact position of the carriage along its path of movement, an encoder system 88 is provided. The encoder system, for example, may be an inductive or capacitative measurement system. One type suitable for the purpose of the present invention may comprise a read head RGH22F and a self-adhesive scale RGS-S available from Renishaw UK. Thus, by means of the encoding system 88, the actual position of the moving carriage as required by a controller (not shown) at any time can be achieved by the combination of the linear motor and the encoder 88.

In a manner similar to the arrangement described above in connection with FIG. 4, all the wiring connecting the electrical and electronic components of the plate carriage assembly with the outside world are channeled by two connectors. Connector 86 transfers the information to the end of a first flexible cable (not shown) attached to support bracket 84. Bracket 84' similarly supports the end of a second cable. Thus, these two brackets support the moving side of the wiring cables. The fixed ends of the carriage cables, if fixedly attached to plate 85, are protected by plate 85'.

Figure 6:
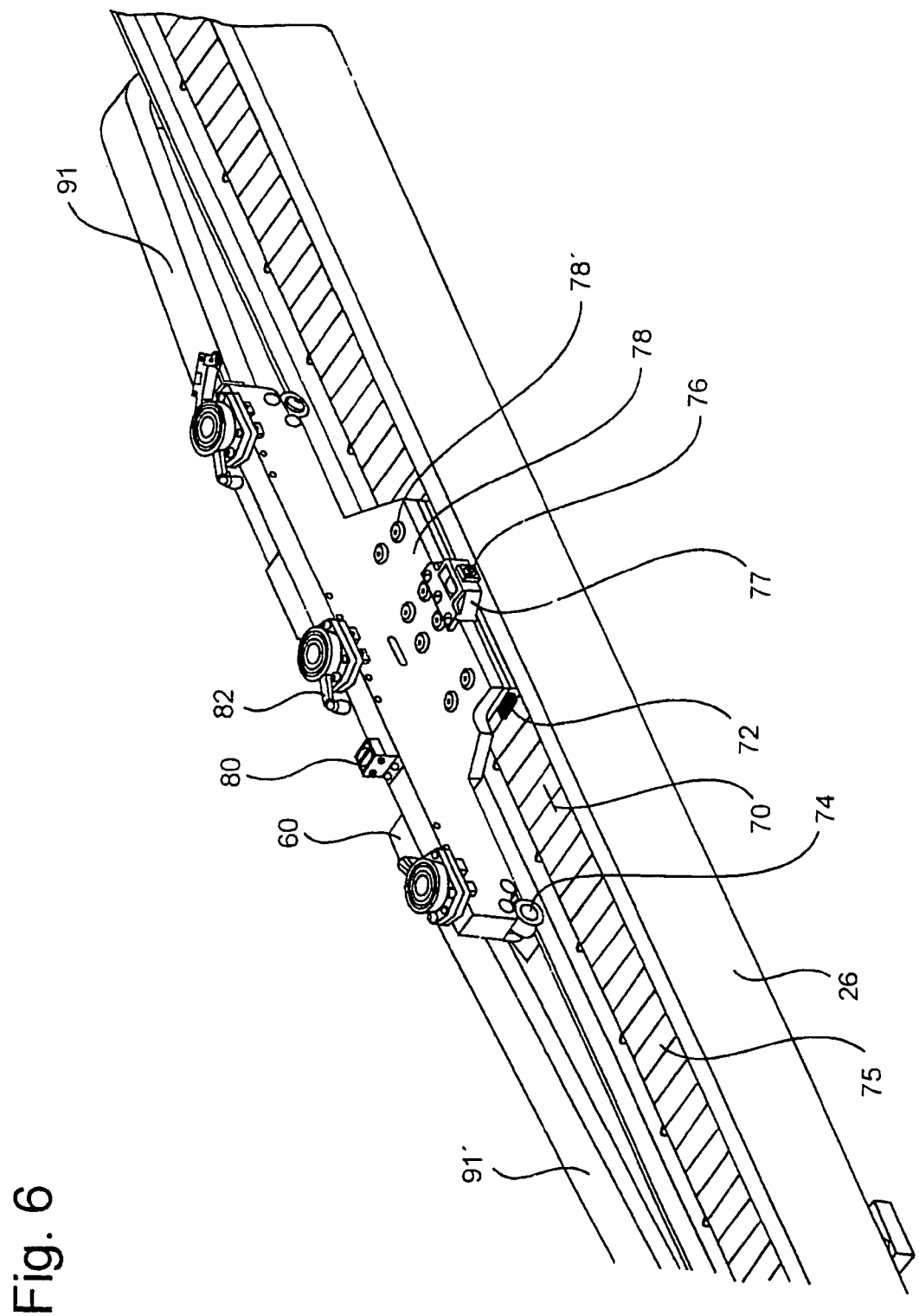
FIG. 6 is an isometric view of the plate mover carriage seen from the other side.

FIG. 6 shows another view of the plate carriage assembly. In this Figure, the fixed part of the linear motor controlling the carriage motion is shown at 70 and the mobile part attached to the carriage at 72. It is attached to an extension 78 by screws 78'. Reference numbers 91 and 91' represent shields covering the wiring cables r connecting the carriage to a fixed part of the machine. FIG. 7 is an end view of the carriage assembly. In addition to the components described in connection with FIGS. 5 and 6, this Figure shows more clearly the two parts of the linear motor of the carriage. The mobile part 72 of the motor is mounted on extension 78 and its fixed part, attached to beam 26 is shown at 70. The encoder located between the carriage and its fixed support is shown at 88. Box 89 schematically represents the shield of the flexible wiring connection. The moving ends of the wiring connection is attached to plate 84 and the fixed part to plate 85 as is also shown in the preceding Figures. The plate carriage slides between rows of bearings 18 in the loading and ejection zones and precision bearings 48, represented more clearly in the cross section of FIG. 7-A. In this Figure. a plate supporting the accurate bearings is shown at 24 and the cover through which the outside periphery of the bearings slightly emerge at 25. The optical head carriage will now be described in connection with FIGS. 8 to 10-A. FIG. 8 represents the head carriage as seen from the back side, that is the side opposite to the side shown in FIG. 4. It is in the form of a relatively flat box containing substantially all the components mentioned above in connection with the description of FIG. 4. The head carriage is provided with two grooved wheels 124 and a roller 126 located in a bracket 127. It can slide along rails 120 and 122 attached to beam 20, substantially located in the same vertical plane, by the action of a linear motor of the type shown in FIG. 8-A. This motor comprises movable parts 137 and 138 and a fixed elongated part 142. The latter has two wings 147 and 148 between which movable part 138 moves when appropriate electrical energy is fed to its coils. As shown in FIG. 8, movable parts 137 and 138 of the linear motor are firmly attached to the body 32 of the head by a bracket 139 and the fixed channel-like part of the motor is secured to a stationary support. The purpose of bracket 139 is to place moving part 138 between the two stationary legs 142 of the motor. The moving parts of the motor are firmly attached to bracket 139 between two ears 146 and screws not shown. Bracket 139 in turn is also attached to the head by screws 135 so that head 32 and the movable parts of the motor move in unison. According to a preferred embodiment of the invention the carriage head may be attached to its driving component at a point at or near its center of gravity and substantially at the center of its supporting vertical rails. The head can move at a constant speed of, e.g., 1.2 m/s for the projection of a swath. Its special construction, made of light but rigid material makes it possible to minimize the effects of inertia. Although the head carries all the components necessary to project images, the deceleration and reversal time has been reduced to about 60 milliseconds, approximately equal to the time taken by the plate to be moved from one swath to the next one. This permits a high production rate.

The electrical wiring to the linear motor 137 is located in a conduit 130 attached to the head by clips 131. This wiring as well as all the other wiring connecting the moving head to its base are channeled through connectors 132. Compressed air is channeled through piping 128 to nozzle 152 to blow air under lens 39. Terminals for the high energy required by the motor are shown at 153 and 154. Connectors 155 and 156 represent the input and output of a cooling fluid which may be necessary by the high power laser diode located inside the head enclosure.

Figure 9:
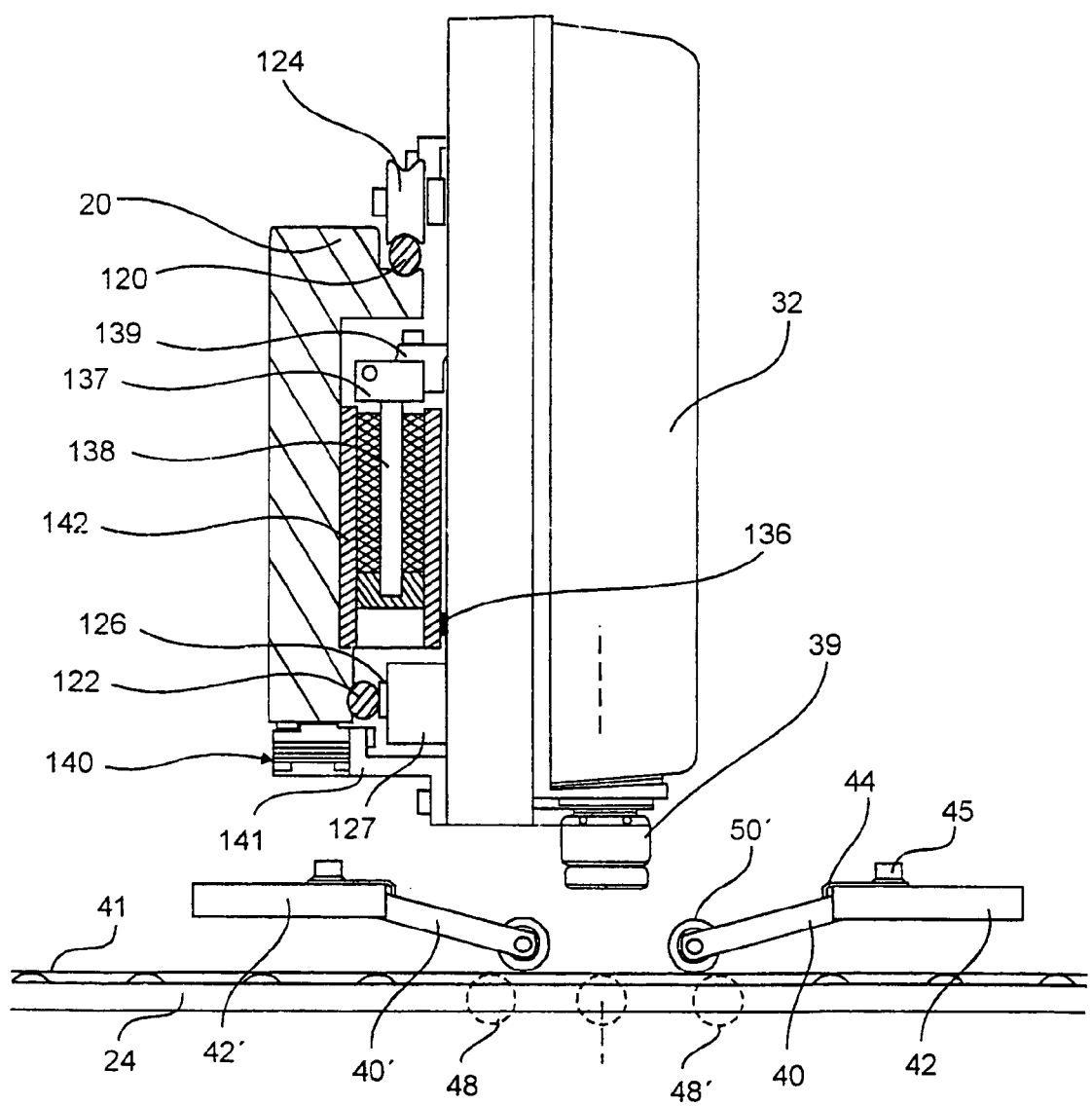
FIG. 9 is an end view of the optical head with a partial cross section.

The moving part of the encoder of the head assembly detecting the precise location of the head along its rails is shown at 140. Small magnets shown at 136 in this Figure are mounted on, preferably cemented against the body of the head as shown in FIG. 9. Their purpose is to maintain the head firmly against the roller 126 supported by bracket 127 (see also FIG. 9).

A side view of the optical head assembly is shown in FIG. 9 together the central area of the imaging zone 10. In this Figure, the same components as shown in the preceding Figures are designated by the same reference numbers. Thus, the carriage supporting beam attached to the frame of the machine is shown at 20 and its rails at 120 and 122. The moving part of the coder is shown at 140, supported by bracket 141. The moving parts of the linear motor are shown at 137 and 138 and the fixed part at 142.

The bottom part of FIG. 9 completes FIG. 4 representing the imaging zone 10 of the machine and the two Figures should be considered closely related. Head 32 moves above the central zone of the imaging zone 10, substantially along line 46. As can be seen in FIG. 9 the pressure rollers such as 50 and 50' are slightly offset from opposite supporting bearings 40 and 40' in order to slightly urge the area of the plate comprised between rows 50 and 50' against central bearing rows located along line 46. It has been experimentally found that this is an excellent arrangement enabling the distance between the lens and the plate to be kept within a predetermined range, e.g., ±50 microns.

FIG. 10 schematically represents an alternative method used for centering the images on a plate. In this Figure, the head 32' is provided with a box 150 supported by brackets 151. This box includes photoelectric means to detect the edges of the plate as the head moves transversally along line 9. This approach makes it possible to program the starting and finishing points of the head travels, and to center images on the plate. FIG. 10-A represents the outline of the head equipped with detection unit 150 supported by bracket 151.

Figure 11:
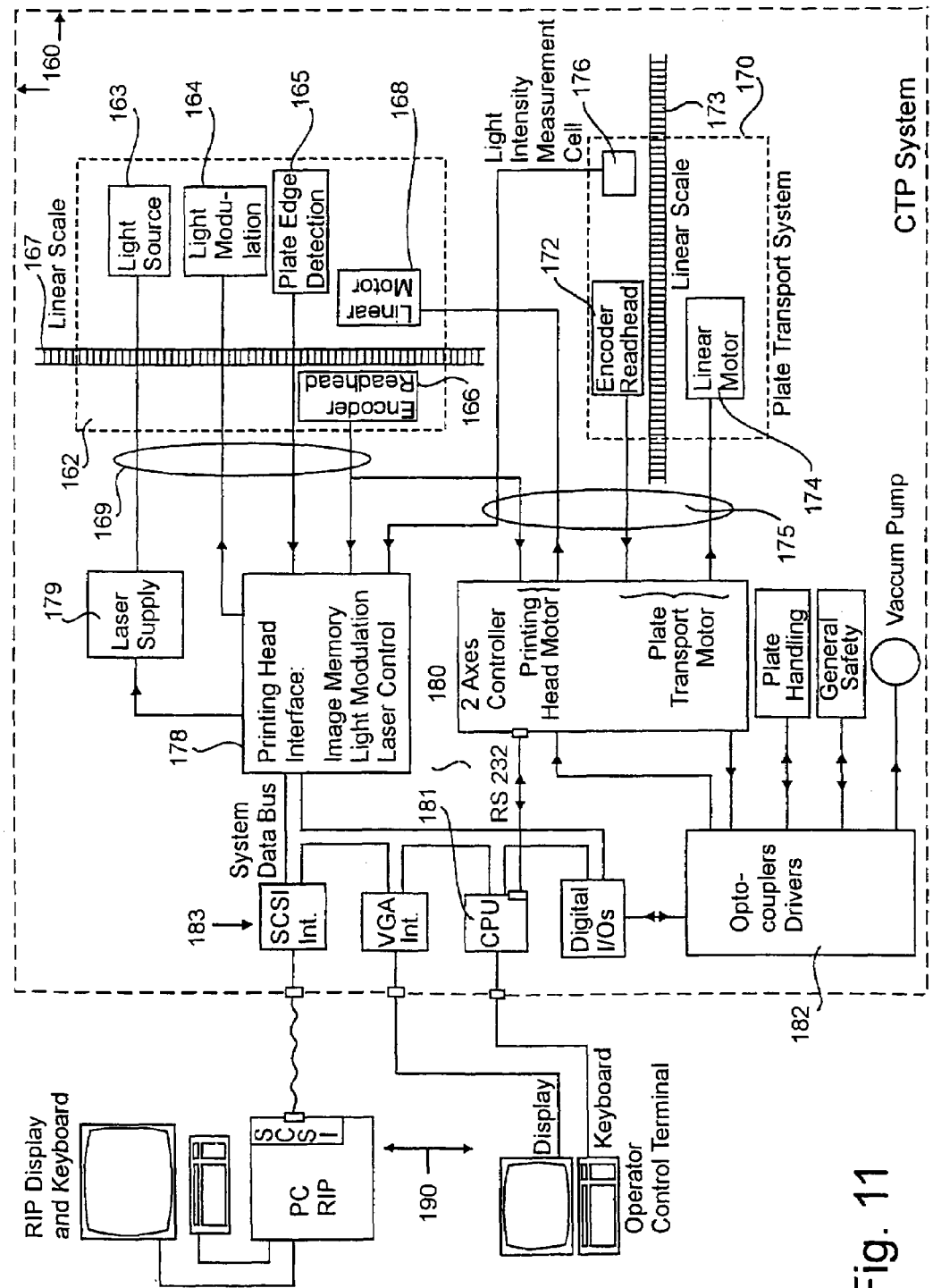
FIG. 11 is a block diagram of the electrical electronic and computerized controls of the platesetter and its connection with the outside world.

FIG. 11 is a simplified block diagram of the platesetter system as per the invention. All the elements within the limits of box 160 are part of the platesetter unit as described above. All the elements of box 162 are included in the travelling head of the machine, also called imaging or printing head. As mentioned as a characteristic of a preferred embodiment of the invention, it includes all what is necessary to project images, in particular a laser unit 163, a light modulator 164, a plate edge detector 165, the moving part 168 of a linear motor and an encoder 166. Wiring or ducts globally shown at 169 connect the moving head to stationary supplies or controllers. Box 170 represents the components of the plate mover unit. In addition to vacuum grippers, it includes the moving part of a linear motor 174, a light intensity measuring cell 176 and an encoder 172 co-operating with fixed scale 173. The elements of box 170 are connected to stationary sources via connectors 175. These sources include the laser supply 179, the travelling head interface 178 and two-axis controller 180. Other electronic controls of the platesetter are represented at 182 and 183. The CPU 181 controls the operation of the machine. Data on the location of the head along its rails and its speed are transferred to block 178 by encoder 166. Information concerning the state and displacement of the plate-mover are transferred to block 170 by encoder 172. All these controls insure the safe and efficient travels of the head and of the pate-mover. They insure the best performance achievable also rendered possible by the fact that the time taken by the head at the end of one scan for deceleration, reversal and acceleration is approximately the same as the time taken by the plate mover to move one step, including stabilisation time.

The imaging method according to the present invention will now be illustrated with reference to FIGS. 12-A to 17-B in which the travel of a plate will be described. In each of these Figures, the section referenced A represents a side view and section referenced B a top view. FIG. 12 represents the platesetter at rest. As explained above, it comprises a loading zone 8, a printing or imaging zone 10 and an ejection zone 12. In the Figure, the vacuum grippers are not energized and the carriage is at its home position. FIG. 12 also shows a supply zone 7 into which plates are fed either manually or automatically. A plate to be imaged can be moved toward the loading zone 8 by pivoting hinged wing 158 of the table or otherwise if an automatic plate handling system is associated with the platesetter. FIG. 12, represents the machine waiting for the first plate. In this Figure, positioning elements 55, 55' and 57 are in their rest position, away from the area to be occupied by the plate. This "rest" position can be adjusted if desired to accommodate plates of different formats. The first plate 116 is waiting in the supply zone 7, prevented from sliding further by pins 53. When the system is ready to handle the first plate, pins 53 are moved out of the way so that plate 116 can slide down to loading area 8. It now sits against elements or pins 59, 59' while centering pins 55, 55' and 57 move toward the center of area 8 to center the plate. Upon a "go" signal received from the controller, the centering pins are moved away as indicated by arrows in FIG. 13-B. Plate 116, now attached to the plate moving carriage after energization of the suction cups is allowed to move through the imaging area 10, as illustrated in this FIG. 13-B. In the meantime, following plate 117 which was waiting in the supply area is allowed to move down, as shown in FIG. 14-B, where it is waiting for the centering operation to take place while plate 116 is reaching the end of the imaging stage. At the completion of this stage, plate 116 is released from the grippers of carriage 60 and left in the evacuation or ejection zone 12 from which it will be manually or automatically removed while carriage 60 returns home, ready to pick up the following plate 117. The same sequence as above will be repeated for this plate 117 while the following plate 118 is waiting in the supply zone, and the process can continue for succeeding plates.

Figure 18:
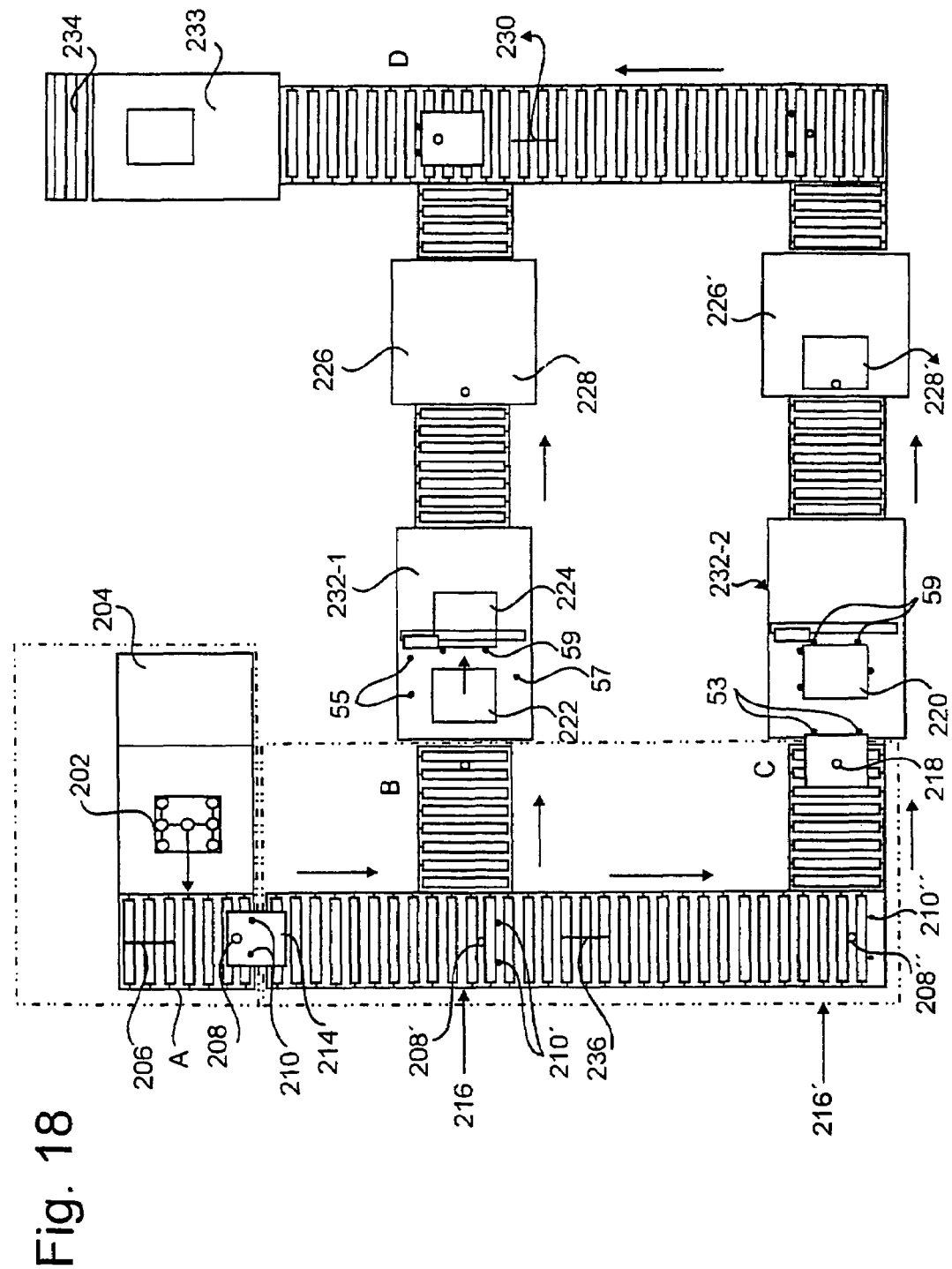
FIG. 18 is a schematic representation of a multiple plate handling system incorporating two independent platesetter units.

FIG. 18 represents a system comprising two platesetters served by a common plate-handling unit. It consists mainly of feed chain A, exit chain D and a number of branch chains B and C located between A and D, each serving separate platesetter units 232-1, 232-2, 232-n. Captors 208, 208', 208" and stop pins 210, 210', 210" are located at strategic points along the chains. They may be located on chain A, at the intersections of this chain with chains B and C. They are associated with pushers 216 and 216' whose purpose is to transfer plates from chain A to branch chains B or C. Thus, they may be located at the entrance to platesetter systems 232-1 and 232-2 located on branch chains B and C. They are associated with sensors for the purpose of detecting the presence of a plate. Their purpose is to control the up and down motion of stop pins. These stop pins square up and maintain a plate in position until they are pulled back upon receipt of a "signal to proceed" sent by one or another imaging unit.

As shown in the drawing, in the first platesetting unit 232-1, plate 224, just emerging from the imaging zone of the unit, is still under the dependence of the plate drive carriage. It is on its way to processor 226 while the following plate 222, having reached the inclined ball bearing zone 8, is sliding down toward pins 59 against which it will be maintained while pins 53 and 57 move toward each other to center the plate. In the meantime, in the second platesetting unit 232-2, plate 228 is moved to processor 226' after imaging has been completed, thus allowing this unit to receive following the plate 220. This plate, momentarily maintained by the pins of unit 232-2, will be released as soon as it has been picked up by the returned plate carriage to be carried to the imaging zone of unit 232-2. The following plate 218 stopped by pins 53 at the entrance of the inclined table of section 7, will be released and allowed to enter the inclined zone as soon as retaining pins 53 receive a signal signifying the end of the imaging stage of preceding plate 220. In the meantime, plate 214 previously removed from loader 202 and freed from interleaf paper by stripper 204 has moved to section 206 of chain A. It moves down over the rollers of chain A after it has been released by retaining pins. It will continue its motion down chain A and to be directed to the next available platemaking unit.

The process continues with following plates as they are released one by one from loader 202 at the command of the general control of the system. They queue toward platesetting units and then to plate processors attached to each unit and finally, over rollers 230 of chain D, to bender 233 and stocker 234.

While the invention has been described with reference to its preferred embodiments, it will be understood by those skilled in the art that various changes may be made without departing from the scope of the invention.

The invention claimed is:

1. A flat bed plate setter system for imaging radiant energy onto a printing plate, the system comprising:
   a stationary supporting bed;
   drive means for engaging the printing plate in direct contact with the stationary support bed and sliding the printing plate on the support bed in a direction of movement; and
   an optical head being movably mounted on a stationary bridge, adapted to move across the direction of movement of the printing plate and being provided for emitting radiant energy onto the printing plate.

2. A flat bed plate setter system for imaging radiant energy onto a printing plate, the system comprising:
   a stationary supporting bed;
   a carriage for engaging the printing plate in direct contact with the stationary support bed and sliding the printing plate on the supporting bed in a direction of movement; and
   an optical head movably mounted on a stationary bridge and adapted to move across the direction of movement of the printing plate, wherein the optical head comprises emitters for emitting radiant energy onto the printing plate.

3. The system of claim 2, wherein the carriage has a base located under a supporting bed with sliding elements and a protruding section carrying suction cups and disposing the suction cups at the level where the printing plate is in direct contact with the stationary supporting bed.

4. The system of claim 2, wherein the optical head is located in a container, and a lens, an edge detector, roller bearings, a moving part of a linear motor, an encoder and connectors are all located on a first side of at least one supporting rail, and all connecting conduits are located on a second side of the rail to balance the weight of the optical head.

5. The system of claim 4, wherein the carriage is attached to the linear motor at the center of gravity of the carriage.

6. A method for imaging a printing plate with radiant energy in a flat bed plate setter, the method comprising:
(a) providing a flat bed plate setter having a stationary support area;
(b) disposing a printing plate on, and in direct contact with, the stationary support area;
(c) positioning the printing plate in a defined and centered position on the support bed;
(d) sliding the printing plate in a first direction; and
(e) moving a radiant energy emitting head in a second direction substantially perpendicular to the first direction to provide an image on the printing plate.

7. The system of claim 1, wherein the stationary support bed comprises a field of roller bearings extending the length of the plate setter.

8. The system of claim 2, wherein the carriage is configured to hold the printing plate from underneath as the carriage slides the printing plate on the stationary support bed.

9. The system of claim 2, wherein the carriage comprises:
a front sensor for detecting a printing plate ahead of the printing plate being slid by the carriage in the first direction, and
a rear sensor for detecting a printing plate behind the printing plate being slid by the carriage in the first direction.

10. The system of claim 2, wherein the carriage is substantially narrower than the width of the printing plate across the direction of movement of the printing plate.

11. The method of claim 6, further comprising attaching the positioned printing plate to a carriage which is substantially narrower than the width of the printing plate across the direction of movement of the printing plate.

12. The method of claim 6, wherein the step of moving the radiant energy emitting head comprises moving an optical head, on which the radiant energy emitting head is mounted, on a stationary bridge across the direction of movement of the printing plate.

13. A plate setter system for imaging radiant energy onto a printing plate, the system comprising:
a support bed comprising a stationary support surface sufficiently large to receive and directly support the printing plate with one face of the printing plate in sliding contact with the support surface;
a printing plate positioning means for bringing the printing plate into a defined and centered position;
drive means for sliding the printing plate over the stationary support surface in a direction of movement;
an optical head movably mounted on a stationary bridge and adapted to move across the direction of movement of the printing plate, the optical head being adapted to emit radiant energy onto the printing plate; and
a plurality of bearings configured to maintain a portion of the printing plate at a predetermined distance from the optical head.

14. The system of claim 13, wherein the optical head is adapted to focus the radiant energy onto a focus plane, and the plurality of bearings are configured to maintain the portion of the printing plate in the focus plane.

15. The system of claim 14, wherein the plurality of bearings comprises a first row of bearings located under the printing plate and a second row of bearings over the printing plate.

16. The system of claim 14, wherein the plurality of bearing comprise a plurality of rows of precision bearing and corresponding plurality of rows of pressure bearings, the rows of pressure bearings being offset from the corresponding rows of precision bearing.

17. A plate setter system for imaging radiant energy onto a printing plate, the system comprising:
a support bed having a support field defining a support plane;
a printing plate positioning means for bringing the printing plate into a defined and centered position;
a carriage movable across the support field in a direction of movement and having a holder adapted to secure the printing plate to the carriage and maintain the printing plate at the level of the support plane and in direct contact with the support bed; and
an optical head movably mounted on a stationary bridge and adapted to move across the direction of movement of the carriage, the optical head comprising emitters for emitting radiant energy onto the printing plate.

18. The plate setter system of claim 17, wherein the carriage is moveable across the support field in stepwise motion.

19. The plate setter system of claim 17, wherein the support is adapted to maintain the printing plate at a precise distance from the optical head while the carriage moves the printing plate across the support field.

20. The plate setter system of claim 17, wherein the support bed is adapted to maintain the printing plate flat in the support plane.

21. The plate setter system of claim 17, wherein the carriage is adapted to securely maintain the printing plate in a stationary position while the optical head moves and emits energy onto the printing plate.

22. The plate setter system of claim 1, wherein the carriage is moveable across the support field in stepwise motion.

23. The plate setter system of claim 1, wherein the support is adapted to maintain the printing plate at a precise distance from the optical head while the carriage moves the printing plate across the support field.

24. The plate setter system of claim 1, wherein the support bed is adapted to maintain the printing plate flat in the support plane.

25. The plate setter system of claim 1, wherein the carriage is adapted to securely maintain the printing plate in a stationary position while the optical head moves and emits energy onto the printing plate.

26. The plate setter system of claim 2, wherein the carriage is moveable across the support field in stepwise motion.

27. The plate setter system of claim 2, wherein the support is adapted to maintain the printing plate at a precise distance from the optical head while the carriage moves the printing plate across the support field.

28. The plate setter system of claim 2, wherein the support bed is adapted to maintain the printing plate flat in the support plane.

29. The plate setter system of claim 2, wherein the carriage is adapted to securely maintain the printing plate in a stationary position while the optical head moves and emits energy onto the printing plate.

30. The plate setter system of claim 1, comprising a printing plate positioning means for bringing the printing plate into a defined and centered position.

31. The system of claim 2, comprising a printing plate positioning means for bringing the printing plate into a defined and centered position.

* * * * *